(12) United States Patent
Yamamoto et al.

(10) Patent No.: US 8,481,674 B2
(45) Date of Patent: Jul. 9, 2013

(54) POLYMER, SEMICONDUCTOR FILM, ELECTRODE, ELECTRODE ACTIVE MATERIAL, ELECTROCHEMICAL ELEMENT AND ELECTRICITY STORAGE DEVICE

(75) Inventors: Takakazu Yamamoto, Kanagawa (JP); Hiroki Fukumoto, Kanagawa (JP); Takahisa Shimizu, Kanagawa (JP); Tomoaki Yanagida, Kanagawa (JP); Yu Ohtsuka, Osaka (JP); Nobuhiko Hojo, Osaka (JP)

(73) Assignee: Panasonic Corporation, Osaka (JP)

( * ) Notice: Subject to any disclaimer, the term of this patent is extended or adjusted under 35 U.S.C. 154(b) by 352 days.

(21) Appl. No.: 12/995,374

(22) PCT Filed: Jul. 31, 2009

(86) PCT No.: PCT/JP2009/003656
§ 371 (c)(1),
(2), (4) Date: Nov. 30, 2010

(87) PCT Pub. No.: WO2010/013492
PCT Pub. Date: Feb. 4, 2010

(65) Prior Publication Data
US 2011/0086267 A1    Apr. 14, 2011

(30) Foreign Application Priority Data
Jul. 31, 2008   (JP) .................................. 2008-198501

(51) Int. Cl.
*C08G 75/00* (2006.01)
(52) U.S. Cl.
USPC ........... 528/377; 528/380; 528/370; 429/206; 429/213; 429/188; 526/256

(58) Field of Classification Search
USPC .................. 528/377, 380, 370; 429/206, 213, 429/188; 526/256
See application file for complete search history.

(56) References Cited

U.S. PATENT DOCUMENTS
2004/0045818 A1   3/2004   Inatomi et al.
2004/0214082 A1   10/2004  Inatomi et al.

FOREIGN PATENT DOCUMENTS
| JP | 01-289013 | 11/1989 |
| JP | 2004-111374 | 4/2004 |
| JP | 2004-342605 | 12/2004 |
| JP | 2008-159275 | 7/2008 |

OTHER PUBLICATIONS

Yamamoto, T., et al., "New Soluble π-Conjugated Tetrathiafulvalene (TTF) Polymers Bearing Long Alkyl Side Chains: Preparation by Organometallic Polycondensation, Structure and Chemical Properties of the Polymers", Mol. Cryst. Liq. Cryst., 2002, pp. 101-112, vol. 381.
Yamamoto, T., "Mini Review Cross-coupling reactions for preparation of π-conjugated polymers", Journal of Organometallic Chemistry, 2002, pp. 195-199, 653, Elsevier Science B.V.
Wang, E., et al., "Synthesis and Characterization of New Type Molecular Wires with Tetrathiafulvalene as Redox Center", Journal of Polymer Science Part A: Polymer Chemistry, 2006, pp. 2707-2713, vol. 44 No. 8.
Yamamoto, T., et al., "New π-conjugated polymers containing tetrathiafulvalene as the monomeric unit", Journal of Materials Chemistry, 1997, pp. 1967-1968, vol. 7 No. 10.
Zhao, Y., et al., "Synthesis, Spectroscopic, Electrochemical and $Pb^{2+}$-Binding Studies of Tetrathiafulvalene Acetylene Derivatives", Journal of Organic Chemistry, 2007, pp. 3632-3639, vol. 72 No. 10.

*Primary Examiner* — Shane Fang
(74) *Attorney, Agent, or Firm* — McDermott Will & Emery LLP

(57) ABSTRACT

A polymer having a repeating unit structure represented by the following general formula (1), wherein in general formula (1), Ph is a phenyl group; X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom:

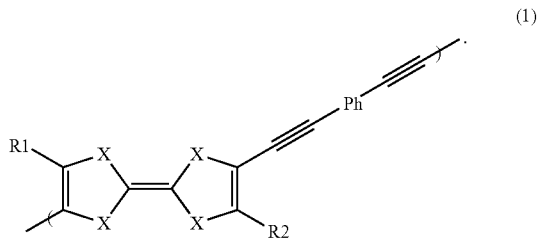

(1)

24 Claims, 4 Drawing Sheets

POLYMER, SEMICONDUCTOR FILM, ELECTRODE, ELECTRODE ACTIVE MATERIAL, ELECTROCHEMICAL ELEMENT AND ELECTRICITY STORAGE DEVICE

RELATED APPLICATIONS

This application is the U.S. National Phase under 35 U.S.C. §371 of International Application No. PCT/JP2009/003656, filed on Jul.31, 2009, which in turn claims the benefit of Japanese Application No. 2008-198501, filed on Jul.31, 2008, the disclosures of which Applications are incorporated by reference herein.

TECHNICAL FIELD

The present invention relates to a polymer reversibly oxidizable/reduceable; and a semiconductor film, an electrode, an electrode active substance, an electrochemical element and an electricity storage device using such a polymer.

BACKGROUND ART

Recently, mobile electronic devices such as mobile audio devices, mobile phones, laptop computers and the like have been widely used, and various types of secondary batteries have been used as power supplies for such mobile electronic devices. Also, a demand for secondary batteries having a much larger capacity than is provided for the mobile electronic devices has been increased. For example, from the viewpoint of energy savings or reduction of carbon dioxide emission, hybrid vehicles using an electric driving power in addition to the conventional internal combustion engine are becoming popular. For these reasons, secondary batteries having further improved characteristics of output, capacity, cycle life and the like are now desired regardless of the usage.

A secondary battery accumulates charges using an oxidation/reduction reaction. Therefore, a substance which is reversibly oxidation/reduction-reactable, namely, an electricity storage material which accumulates charges, significantly influences the above-described characteristics of the secondary battery. Conventional secondary batteries use metals, carbon, inorganic compounds and the like as the electricity storage materials. In the case of, for example, lithium secondary batteries widely used today, metal oxides, graphite and the like are used as positive electrode active substances and negative electrode active substances, which are electricity storage materials.

In place of these inorganic materials, it is now being studied to use organic compounds as the electricity storage materials. Organic compounds allow more diversified molecule designs than inorganic compounds. Therefore, it is considered that when an organic compound is used as an active substance, such an active substance can have any of various characteristics in accordance with the molecule design.

Organic compounds are more lightweight than metals. Therefore, when a secondary battery is produced using an electricity storage material formed of an organic compound, the obtained secondary battery can be lightweight. For this reason, organic compounds are considered to be preferable for secondary batteries for hybrid vehicles, which do not need to have a high charge density but need to be lightweight. It is also being studied to use capacitors as electricity storage devices for hybrid vehicles. The above-described advantages of organic compounds are also provided when electricity storage materials formed of organic compounds are used for capacitors using a chemical reaction.

In Patent Documents Nos. 1 and 2, the present inventors have proposed an organic compound having a $\pi$-conjugated electron cloud as a novel electricity storage material which can provide high speed charge/discharge, and clarified a reaction mechanism thereof.

CITATION LIST

Patent Literature

Patent Document No. 1: Japanese Laid-Open Patent Publication No. 2004-111374

Patent Document No. 2: Japanese Laid-Open Patent Publication No. 2004-342605

SUMMARY OF INVENTION

Technical Problem

For an electrolytic solution of an electricity storage device, a non-aqueous solvent is used in order to broaden the usable voltage range. Therefore, when an organic compound is used as the electricity storage material, a problem arises that the electricity storage material may occasionally elute into the electrolytic solution. Even if the solubility of the electricity storage material in the electrolytic solution is not very high, if the electricity storage material elutes little by little by the repetition of the charge/discharge operation, a good charge/discharge cycle characteristic is not obtained.

An organic compound which is highly stable and reversibly oxidation/reduction-reactable is considered as being usable as an organic superconductor material, an organic conductor material, an organic semiconductor material, or an organic magnetic material by being controlled in terms of electric conductive characteristic or magnetic characteristic thereof. An organic compound for these uses is occasionally desired to be difficult to be dissolved in an organic solvent. However, there is no knowledge regarding which structure of organic compound can suppress elution into an electrolytic solution and provide a good charge/discharge cycle characteristic, magnetic characteristic or semiconductor characteristic.

The present invention has an object of solving such problems of the conventional art and providing a novel organic compound which is difficult to elute into an organic solvent, is reversibly oxidation/reduction-reactable, and is stable in an oxidized or reduced state.

Solution to Problem

A polymer according to the present invention is represented by the following general formula (1).

[Chemical formula 1]

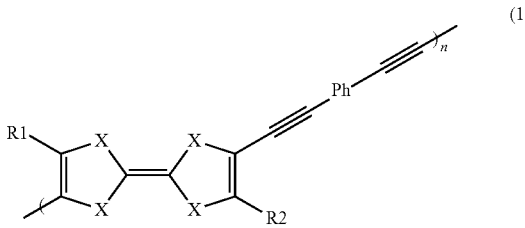

(1)

In general formula (1), Ph is a phenyl group; X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In a preferable embodiment, the polymer has a structure represented by the following general formula (2).

[Chemical formula 2]

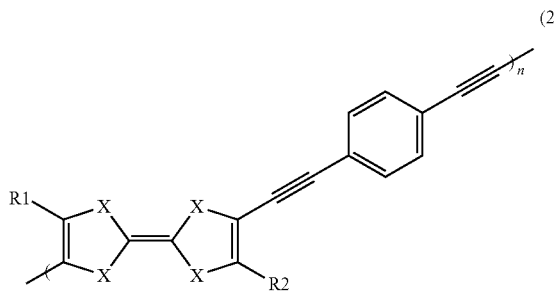

(2)

In general formula (2), X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In a preferable embodiment, the polymer has a structure represented by the following general formula (3).

[Chemical formula 3]

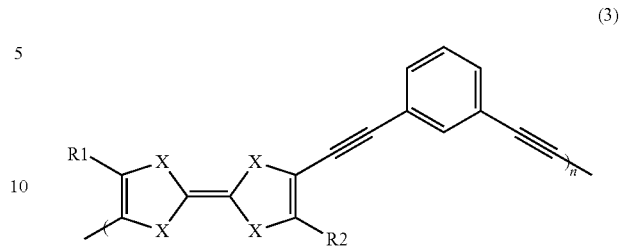

(3)

In general formula (3), X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In a preferable embodiment, X is a sulfur atom.

In a preferable embodiment, n is 4 or greater.

In a preferable embodiment, X is a sulfur atom, and R1 and R2 are each a chained saturated hydrocarbon group.

In a preferable embodiment, X is a sulfur atom, and R1 and R2 are each a phenyl group.

In a preferable embodiment, X is a sulfur atom, and R1 and R2 are each a methyl group.

A semiconductor film according to the present invention contains the polymer defined by any one of the above.

An electrode according to the present invention includes a conductive support; and a polymer film provided on the conductive support and containing the polymer defined by any one of the above.

In a preferable embodiment, the polymer film contains a conductive substance.

An electrode active substance according to the present invention is represented by the following general formula (1).

[Chemical formula 4]

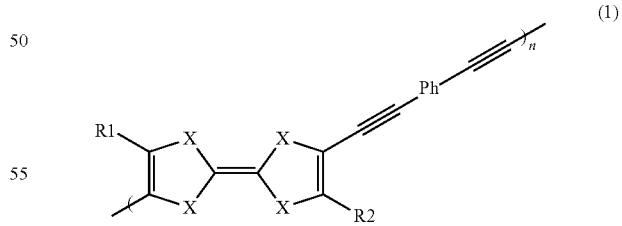

(1)

In general formula (1), Ph is a phenyl group; X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In a preferable embodiment, the electrode active substance has a structure represented by the following general formula (2).

[Chemical formula 5]

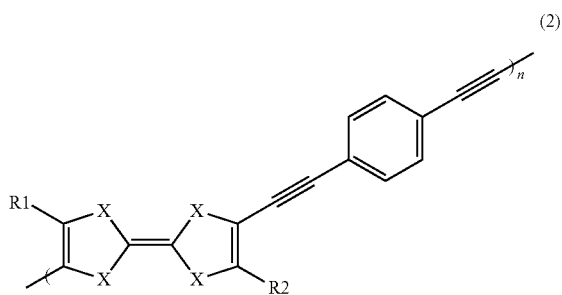

(2)

In general formula (2), X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In a preferable embodiment, the electrode active substance has a structure represented by the following general formula (3).

[Chemical formula 6]

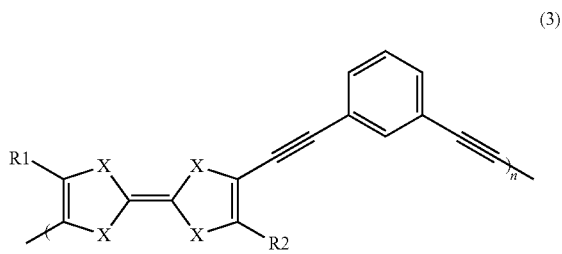

(3)

In general formula (3), X is an oxygen atom, a sulfur atom, a selenium atom or a tellurium atom; and R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In a preferable embodiment, X is a sulfur atom.

In a preferable embodiment, n is 4 or greater.

In a preferable embodiment, X is a sulfur atom, and R1 and R2 are each a chained saturated hydrocarbon group.

In a preferable embodiment, X is a sulfur atom, and R1 and R2 are each a phenyl group.

In a preferable embodiment, X is a sulfur atom, and R1 and R2 are each a methyl group.

An electrochemical element according to the present invention includes a positive electrode, a negative electrode, and an electrolytic solution located between the positive electrode and the negative electrode. At least one of the positive electrode and the negative electrode is an electrode containing the electrode active substance defined by any one of the above.

In a preferable embodiment, the electrolytic solution contains a salt of quaternary ammonium cation or lithium ion and anion.

An electricity storage device according to the present invention includes a positive electrode containing the electrode active substance defined by any one of the above; a negative electrode containing a negative electrode active substance capable of occluding and releasing lithium ion; and an electrolytic solution containing a salt formed of the lithium ion and anion, and filling a space between the positive electrode and the negative electrode.

A mobile electronic device according to the present invention includes the electricity storage device defined by any one of the above.

A vehicle according to the present invention includes the electricity storage device defined by any one of the above.

Advantageous Effects of Invention

A polymer according to the present invention contains a tetrachalcogenofulvalene structure in a repeat unit of a main chain thereof. Since the tetrachalcogenofulvalene structure which is reversibly oxidation/reduction-reactable is polymerized, the molecular weight of a molecule containing the tetrachalcogenofulvalene structures is increased, and the solubility thereof in an organic solvent is decreased. Therefore, an electricity storage material according the present invention is difficult to elute into an organic solvent.

Since the tetrachalcogenofulvalene structures are contained in the main chain of the polymer, a site which is subjected to an oxidation/reduction reaction contributes to the increase of the molecular weight of the polymer without the reversible oxidation/reduction reaction characteristic of tetrachalcogenofulvalene being spoiled. Therefore, a polymer structure, in which a portion not subjected to the oxidation/reduction reaction is as small as possible, can be formed. Owing to this, an electricity storage material having a high energy density and a superb charge/discharge or oxidation/reduction cycle characteristic can be realized. Also, an electricity storage device which provides a large output and has a large capacity and a superb cycle characteristic can be provided.

In a polymer according to the present invention, the tetrachalcogenofulvalene structure is polymerized via acetylene and a phenyl group (—C≡C-Ph-C≡C—) and thus forms the main chain. Therefore, acetylene and the phenyl group suppress electronic interaction caused between the tetrachalcogenofulvalene structures, and thus the stability of each tetrachalcogenofulvalene structure against the electrochemical oxidation/reduction can be improved.

DESCRIPTION OF EMBODIMENTS

Figure 1:
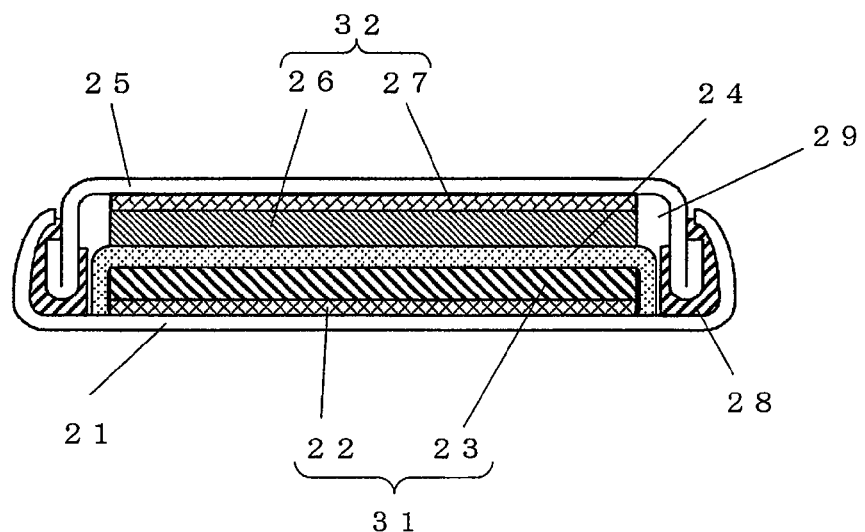
FIG. 1 is a schematic cross-sectional view showing a coin-type electricity storage device, which is an embodiment of an electricity storage device according to the present invention.

The present inventors synthesized a novel polymer represented by the following general formula (1) as an organic compound which is difficult to elute into an organic solvent, is reversibly oxidation/reduction-reactable and is stable in an oxidized or reduced state.

[Chemical formula 7]

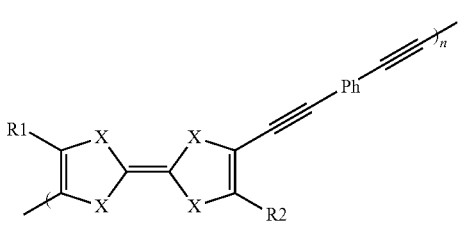

(1)

The polymer represented by general formula (1) is an organic compound reversibly oxidation/reduction-reactable and has a tetrachalcogenofulvalene structure in a repeat unit of a main chain. In general formula (1), X is chalcogen, namely, a group XVI element in the periodic table. Specifically, chalcogen is an oxygen atom, a sulfur atom, a selenium atom or a tellurium atom. Ph represents a bivalent group of a phenyl group and has triple bond carbon bonded at the ortho-position, para-position or meta-position thereof. R1 and R2 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group. The chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom.

In general formula (1), the tetrachalcogenofulvalene structure includes two five-member rings. Each of the two five-member rings contains a chalcogen atom having an unpaired electron and a double bond. Owing to this, a π-conjugated electron cloud in which the five-member rings are delocalized is formed. Therefore, the tetrachalcogenofulvalene structure can be kept stable even in an oxidized state caused by one it electron being released from each of the two five-member rings.

As represented by the following formula (R1), when the tetrachalcogenofulvalene structure represented by general formula (1) is subjected to one-electron oxidation, an electron is pulled out from one of the two five-member rings and so this five-member ring is charged positive. Therefore, one counter anion coordinates to the tetrachalcogenofulvalene structure. When the tetrachalcogenofulvalene structure is further subjected to one-electron oxidation, an electron is pulled out from the other five-member ring and so this five-member ring is charged positive. Therefore, one more counter anion coordinates to the tetrachalcogenofulvalene structure.

The tetrachalcogenofulvalene structure is stable even in an oxidized state, and can be reduced and return to an electrically neutral state by receiving an electron. Accordingly, by using such a reversible oxidation/reduction reaction, the tetrachalcogenofulvalene structure can be used for an electricity storage material in which charges can be accumulated. For example, it is assumed that the polymer represented by general formula (1) is used for a positive electrode of a lithium secondary battery, namely, for an electrode active substance of the positive electrode. In this case, when the battery is discharged, the tetrachalcogenofulvalene structure is put into an electrically neutral state, i.e., in the state shown left in formula (R1). In a charged state, the tetrachalcogenofulvalene structure is in a positively charged state, i.e., in the state shown right in formula (R1).

[Chemical formula 8]

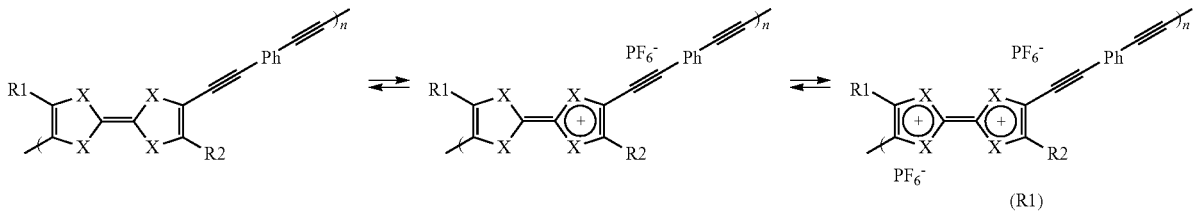

(R1)

An electricity storage material according to the present invention has a structure in which the tetrachalcogenofulvalene structure formed of two five-member rings represented by general formula (1) is contained in a repeat unit of a main chain of the polymer. Tetrachalcogenofulvalene is a compound having a reversible oxidation/reduction characteristic. However, all the derivatives or polymers containing the tetrachalcogenofulvalene structures do not have a good oxidation/reduction characteristic. The oxidation/reduction characteristic may be adversely influenced and lost by some of the structures of the derivatives or polymers. Therefore, a polymer for maintaining the good oxidation/reduction characteristic of tetrachalcogenofulvalene and suppressing elution into an organic solvent needs to be designed. The polymer represented by general formula (1) maintains the reversible oxidation/reduction characteristic of tetrachalcogenofulvalene and also suppresses elution into an organic solvent. The reasons for this will be described below.

In the polymer represented by general formula (1), the tetrachalcogenofulvalene structure is polymerized via acetylene and a phenyl group (—C≡C-Ph-C≡C—) and thus forms the main chain. Therefore, acetylene and the phenyl group suppress an electronic repulsion and electronic interaction caused by the oxidation/reduction reaction between the tetrachalcogenofulvalene structures, and thus the stability of each tetrachalcogenofulvalene structure against the electrochemical oxidation/reduction can be improved. As a result, all the tetrachalcogenofulvalene structures in the polymer can be oxidized or reduced without losing the reversible oxidation/reduction characteristic. Owing to this, for example, where the polymer is used as an electricity storage material, the obtained electricity storage material has a good cycle characteristic.

Since the tetrachalcogenofulvalene structure represented by general formula (1) is polymerized, the molecular weight of a molecule containing the tetrachalcogenofulvalene structures is increased, and the solubility thereof in an organic solvent is decreased. Therefore, in the case where, for example, the polymer represented by general formula (1) is used as an active substance of an electricity storage device using an organic solvent as the electrolytic solution, the elution of the active substance into the electrolytic solution is suppressed, and the deterioration of the cycle characteristic can be prevented.

Especially, because the tetrachalcogenofulvalene structures are contained in the main chain of the polymer, a site which is subjected to an oxidation/reduction reaction contributes to the increase of the molecular weight of the polymer. Therefore, a polymer structure, in which a portion not subjected to the oxidation/reduction reaction is as small as possible, can be formed. Owing to this, an electricity storage material having a high energy density and a superb charge/discharge or oxidation/reduction cycle characteristic can be realized.

As polymers having a π-conjugated electron cloud, polyaniline, polythiophene and derivatives thereof are known. These polymers are very similar to the polymers usable for an electricity storage material according to the present invention on the point of containing a π-conjugated electron cloud in the main chain. However, in polyaniline, polythiophene and derivatives thereof, a resonance structure by a conjugated double bond is formed in the entirety of the main chain. Therefore, when an electron is pulled out from the main chain, the positive charge generated by this is distributed in an area expanded to a certain degree in the main chain. As a result, when it is attempted to pull out another electron successively from an adjacent repeat unit, the positive charge generated by the first electron being pulled out is delocalized over the adjacent repeat unit, which makes it difficult to pull out the electron from the adjacent unit due to an electric repulsion. As a result, it becomes difficult to pull out electrons from all the anilines of polyaniline and from all the thiophenes of polythiophene, which makes it difficult to realize a high energy density for polyaniline and polythiophene.

By contrast, in the case of a polymer having the tetrachalcogenofulvalene structures represented by general formula (1), the π-conjugated electron cloud is delocalized only in each five-member ring. Therefore, the oxidation/reduction reaction is completed within each five-member ring of the polymer. The oxidized state of one five-member ring does not significantly influence the oxidation/reduction reaction of the adjacent five-member ring. For this reason, electrons can be given and received in correspondence with the number of five-member rings contained in the polymer. Namely, the polymer according to the present invention has a large electricity storage capacity.

As described above, it is preferable that the molecular weight of the polymer having the tetrachalcogenofulvalene structures represented by general formula (1) is large so that the polymer is not dissolved in an organic solvent. Specifically, it is preferable that the polymer contains four or more tetrachalcogenofulvalene structures represented by general formula (1); namely, the degree of polymerization of the polymer (n in general formula (1) and also in the following general formulas or chemical formulas) is 4 or greater. With such a molecular weight, a polymer which is difficult to be dissolved in an organic solvent is realized. More preferably, the degree of polymerization of the polymer is 10 or greater, and still more preferably, is 20 or greater.

In the polymer represented by general formula (1), acetylene is preferably added at the para-position or the meta-position of the phenyl group as represented by the following general formulas (2) and (3).

[Chemical formula 9]

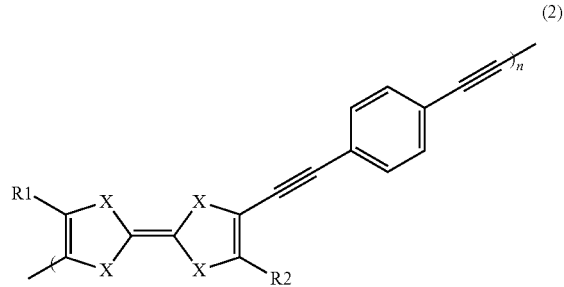

(2)

[Chemical formula 10]

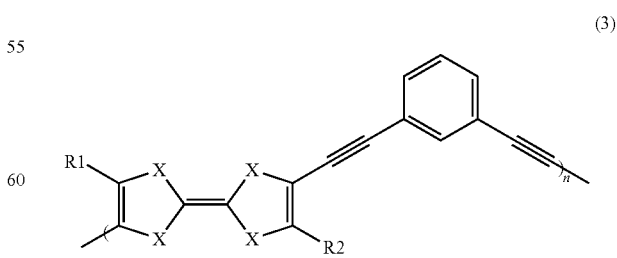

(3)

In general formulas (2) and (3), X is preferably a sulfur atom. R1 and R2 are each preferably a chained saturated hydrocarbon group or a phenyl group.

A polymer according to the present invention can be synthesized by polymerizing monomers containing a repeat unit represented by general formula (1). The synthesis can be done by any method as long as the monomer has the structure represented by general formula (1). However, in order to form a polymer having a high level of regularity, it is preferable that the synthesis is done by polymerization by a coupling reaction.

For example, a polymer represented by general formula (1) (compound 1) can be synthesized by a reaction represented by the following formula (R2). Specifically, compound 1 can be synthesized by dehydrohalogenation polycondensation of an iodine group of tetrathiafulvalene compound 4 having iodine at positions 1 and 3 as substituents and an acetylene group of compound 5 having an acetylene site. This reaction is a cross coupling reaction known as the Sonogashira reaction, and uses a nickel or palladium catalyst and a copper catalyst. For example, an oxidative addition reaction is caused under the presence of a palladium catalyst, so that the palladium catalyst is oxidatively added to compound 4. A copper catalyst is reacted with compound 5, and as a result, copper acetylide in which compound 5 coordinates to copper is generated. Next, an exchange reaction occurs between compound 4 having palladium added thereto and copper acetylide containing compound 5. An isomerization reaction of a complex occurs as a result of an elimination reaction of a ligand, and acetylene having two substituents is generated by a reductive elimination of hydrogen halide. Owing to this, compound 4 and compound 5 are coupling-polymerized, and thus compound 1 is obtained. Both of two ends of the polymer obtained by this reaction is a hydrogen atom or a halogen element derived from the compound used as a starting material.

The polymerization degree of the polymer can be controlled by controlling the reaction catalyst and the reaction temperature. In a coupling reaction using a catalyst such as the Sonogashira reaction, the reaction is stopped when a precipitate is generated as a result of the solubility of the polymer in the reaction solvent being decreased. Therefore, a polymer having a high polymerization degree can be synthesized by selecting, as a reaction solvent, a solvent in which the target polymer has a high solubility. A polymer according to the present invention represented by general formula (2) or (3) has a high solubility in THF, NMP, 1,3-dimethyl-2-imidazolidinone (DMI), DMSO and the like. Especially, THF and NMP are solvents relatively suitable to a coupling reaction. Therefore, for synthesizing a polymer having a high polymerization degree, it is preferable to use THF or NMP as a reaction solvent. More specific examples of synthesis will be described in the following Examples.

[Chemical Formula 11]

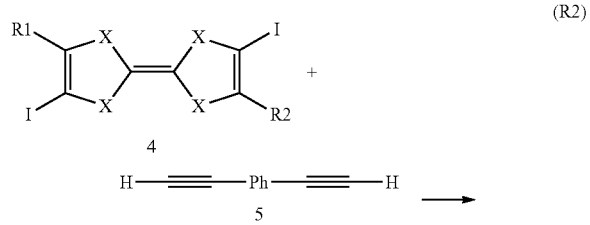

(R2)

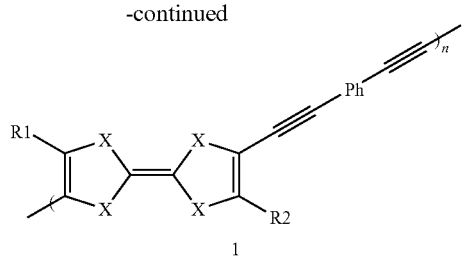

As described above, in a polymer according to the present invention, a tetrachalcogenofulvalene structure is contained in a repeat unit of the main chain thereof. Therefore, the polymer, even though being an organic compound, has a large molecular weight and a low solubility in an organic solvent. Since the tetrachalcogenofulvalene structures are contained in the main chain of the polymer, a site which is subjected to an oxidation/reduction reaction contributes to the increase of the molecular weight of the polymer. Therefore, a polymer structure, in which a portion not subjected to the oxidation/reduction reaction is as small as possible, can be formed. In addition, because the tetrachalcogenofulvalene structure is polymerized via acetylene and phenyl group (—C≡C-Ph-C≡C—), the polymer is improved in the stability against the oxidation/reduction reaction while maintaining the good oxidation/reduction characteristic of tetrachalcogenofulvalene, and suppresses the dissolution into a solvent. Owing to this, a polymer having a high energy density and a superb reversible oxidation/reduction cycle characteristic can be realized. Owing to such features, the polymer according to the present invention is preferably usable as an electricity storage material. The polymer according to the present invention is stable in an oxidized state or a reduced state, and so is preferably usable as an organic superconductor material, an organic conductor material or an organic semiconductor material, all of which use a change of the state of electrons, or as an organic magnetic material. Therefore, using the polymer according to the present invention, molecular lines for electric circuits and devices such as transistors, molecular memories and the like can be realized. The polymer according to the present invention has a characteristic of absorbing ultraviolet-visible light, and so is applicable for photosensitive elements or optical sensors. Hereinafter, specific embodiments of a device using a polymer according to the present invention will be described.

(Embodiment 1)

In this Embodiment, Basic Forms in which a Polymer according to the present invention is used in the state of a film or layer will be described. First, an electrode in which a polymer film or layer containing a polymer represented by general formula (1) is supported by a conductive support will be described. Such an electrode may be used for a secondary battery, which is an electricity storage device described in the next embodiment, a device other than the secondary battery, for example, an electric double layer capacitor, or the like. Alternatively, the electrode is preferably usable for an electrochemical element such as a biochip or the like using a biochemical reaction.

In this case, the polymer film or layer containing a polymer according to the present invention can be formed on a conductive support by any of three methods of a dry method, a wet method and a gas phase method. First, a method of producing an electrode by the dry method will be described.

According to the dry method, a polymer represented by general formula (1) and a binder are mixed together, and the obtained paste is pressure-contacted on a conductive support. Thus, an electrode having a film-like or layer-like polymer pressure-contacted on the conductive support is obtained. The film may be either a fine film or a porous film, but a film produced by the dry method is generally a porous film.

Examples of materials usable as the binder include fluorine-based resins such as poly(vinylidene fluoride), vinylidene fluoride-hexafluoropropylene copolymer, vinylidene fluoride-polytetrafluoroethylene and the like; and hydrocarbon-based resins such as polyethylene, polyimide, polyacrylic resin, cellulose-based resins and the like. From the viewpoint of stability, fluorine-based resins are preferably usable.

Examples of materials usable as the conductive support include metal substrates of Al, SUS, gold, silver and the like; semiconductor substrates of Si, GaAs, GaN and the like; transparent conductive substrates of ITO glass, $SnO_2$ and the like; carbon substrates of carbon, graphite and the like; and conductive organic substrates of polyaniline, polypyrrole, polythiophene and the like.

The conductive support may be an independent fine film or an independent porous film such as a mesh or a net, each of which is formed of any of the above-described materials. Alternatively, the conductive support may be a film of any of the above-described conductive materials formed on a non-conductive support of plastic or glass. Optionally, in addition to the polymer and the binder, a conduction assisting agent, for example, may be mixed in order to improve the electron conductivity in the polymer film or layer. Examples of materials usable as the conduction assisting agent include carbon materials such as carbon black, graphite, acetylene black and the like; and conductive polymers such as polyaniline, polypyrrole, polythiophene and the like. In the polymer film or layer, a solid electrolyte formed of polyethylene oxide or the like, or a gel electrolyte formed of poly(methyl methacrylate) or the like may be contained as an ion-conductive assisting agent.

Now, a method of producing an electrode by the wet method will be described. According to the wet method, a polymer represented by general formula (1) is mixed in, and thus dispersed in, a solvent; the obtained slurry is applied or printed on a conductive support; and the solvent is removed to form a film or layer. Optionally, a conduction assisting agent, a binder or an ion-conductive assisting agent may be mixed in the electrode film or layer like in the case of the dry method. As the conductive support, substantially the same materials as those described above regarding the dry method are usable.

Now, a method for producing an electrode by the gas phase method will be described. According to the gas phase method, a polymer represented by general formula (1) is gasified in vacuum, and the gas-state polymer is deposited on a conductive support and formed into a film. Film forming methods usable in this method are general vacuum film formation processes such as vacuum vapor deposition, sputtering, CVD and the like. Optionally, a conduction assisting agent, a binder or an ion-conductive assisting agent may be mixed in the electrode film like in the case of the dry method. As the conductive support, substantially the same materials as those described above regarding the dry method are usable.

The polymer film or layer containing a polymer according to the present invention may be formed on an insulating or semi-insulating support. As the insulating substrate, a known insulating substrate such as, for example, a glass substrate, a resin substrate or the like is usable. As the semi-insulating substrate, a silicon substrate is usable, for example. A polymer film can be formed on such a substrate by the above-described dry method, wet method or gas-phase method.

In this case, a semiconductor film containing a polymer according to the present invention can be obtained by adding various impurity elements usable for production of a semiconductor to the polymer film. By designing a structure of polymer or a state of electrons using a molecular design technology, it is also possible to form an organic superconductor film, an organic conductor film or an organic magnetic film on an insulating or semi-insulating support.

(Embodiment 2)

Hereinafter, an embodiment of an electricity storage device using a polymer according to the present invention as an electricity storage material will be described with reference to the drawings. In this embodiment, an electricity storage device according to the present invention and an electricity storage material according to the present invention will be described with an example of a lithium secondary battery. However, the present invention is not limited to a lithium secondary battery or a positive electrode active substance of the lithium secondary battery, and is preferably usable for a capacitor or the like using a chemical reaction.

FIG. 1 is a cross-sectional view schematically showing a lithium secondary battery, which is an embodiment of an electricity storage device according to the present invention. The secondary battery shown in FIG. 1 includes a positive electrode 31, a negative electrode 32 and a separator 24. The positive electrode 31 includes a positive electrode active substance layer 23 and a positive electrode current collector 22, and the positive electrode active substance layer 23 is supported by the positive electrode current collector 22. Similarly, the negative electrode 32 includes a negative electrode active substance layer 26 and a negative electrode current collector 27, and the negative electrode active substance layer 26 is supported by the negative electrode current collector 27.

As described below in detail, the positive electrode active substance layer 23 contains an electricity storage material according to the present invention, namely, an electrode active substance, as a positive electrode active substance. Usable as the positive electrode current collector 22 is, for example, a metal foil or a metal mesh formed of aluminum, gold, silver, stainless steel, an aluminum alloy or the like, or a resin film containing a conductive filler formed of such a metal.

The negative electrode active substance layer 26 contains a negative electrode active substance. The negative electrode active substance used here is a known negative electrode active substance for reversibly occluding and releasing lithium. Examples of substances usable as the negative electrode active substance include materials capable of reversibly occluding and releasing lithium such as graphite materials, e.g., natural graphite, artificial graphite, etc., non-amorphous carbon materials, lithium metal, lithium-containing composite nitrides, lithium-containing titanium oxides, silicon, alloys containing silicon, silicon oxides, tin, alloys containing tin, tin oxides, and the like; carbon materials having an electric double layer capacity such as activated carbon, etc.; organic compound materials having a π-conjugated electron cloud; and the like. Such negative electrode materials may be used independently or as a mixture of a plurality thereof. Usable for the negative electrode current collector 27 is a material which is known as being usable for a current collector of a negative electrode of a lithium ion secondary battery, for example, copper, nickel, stainless steel, or the like. Similarly to the positive electrode current collector 22, the negative electrode current collector 27 is usable in the form of a metal foil, a metal mesh or a resin film containing a conductive filler formed of a metal.

The positive electrode active substance layer 23 and the negative electrode active substance layer 26 may respectively contain only a positive electrode active substance and only a negative electrode active substance, or may each contain either one of a conductor or a binder, or both of a conductor and a binder. As the conductor, any of various electron conductive materials which are not chemically changed at a charge/discharge potential of the positive electrode active substance or the negative electrode active substance is usable. Examples of substances usable as the conductor include carbon materials such as carbon black, graphite, acetylene black and the like; conductive polymers such as polyaniline, polypyrrole, polythiophene and the like; conductive fibers such as carbon fiber, metal fiber and the like; metal powders; conductive whiskers; conductive metal oxides; and the like. These materials may be used independently or as a mixture thereof. An ion-conductive assisting agent may be contained in the positive electrode. Usable as the ion-conductive assisting agent is, for example, a solid electrolyte formed of polyethylene oxide or the like, or a gel electrolyte formed of poly(methyl methacrylate) or the like.

Examples of substances usable as the binder include polyolefin resins such as polyethylene, polypropylene and the like; fluorine-based resins such as polytetrafluoroethylene (PTFE), poly(vinylidene fluoride) (PVDF), hexafluoropropylene (HFP) and the like, and copolymeric resins thereof; styrene-butadiene rubber; polyacrylic resin and copolymeric resins thereof; and the like.

The positive electrode 31 and the negative electrode 32 are located such that the positive electrode active substance layer 23 and the negative electrode active substance layer 26 face each other while sandwiching, and being in contact with, the separator 24. Thus, these elements form an electrode group. The separator 24 is a resin layer formed of a resin which does not have electron conductivity, and is a microporous film having a high level of ion permeability and prescribed levels of mechanical strength and electric insulation. For the separator 24, an polyolefin resin such as polypropylene, polyethylene or the like is preferably used because these materials have a high resistance against organic solvent and a high hydrophobicity. These materials are used independently or as a mixture thereof. The separator 24 may be replaced with an ion-conductive resin layer which is swollen with an electrolytic solution and acts as a gel electrolyte.

The electrode group is accommodated in a space inside a case 21. Into the space inside the case 21, an electrolytic solution 29 is injected. The positive electrode 31, the negative electrode 32 and the separator 24 are impregnated with the electrolytic solution 29. The separator 24 includes tiny spaces for holding the electrolytic solution 29. Therefore, the electrolytic solution 29 is held in the tiny spaces, and thus is located between the positive electrode 31 and the negative electrode 32. An opening of the case 21 is sealed by a sealing plate 25 using a gasket 28.

The electrolytic solution 29 is formed of a non-aqueous solvent and a support salt soluble in the non-aqueous solvent. Usable as the non-aqueous solvent is a known solvent usable for a non-aqueous secondary battery or a non-aqueous electric double layer capacitor. Specifically, a solvent containing a cyclic carbonic acid ester is preferably usable because a cyclic carbonic acid ester has a very high relative dielectric constant as exhibited by ethylene carbonate and propylene carbonate. Among cyclic carbonic acid esters, propylene carbonate is preferable because propylene carbonate has a freezing point of −49° C., which is lower than that of ethylene carbonate and thus can cause the electricity storage device to operate even at a low temperature.

A solvent containing a cyclic ester is also preferably usable for the following reason. A cyclic ester has a very high relative dielectric constant as exhibited by γ-butyrolactone. The electrolytic solution 29 containing a solvent which contains a cyclic ester can have a very high relative dielectric constant as a whole.

As the non-aqueous solvent, one of the above-described substances may be used or a mixture of a plurality thereof may be used. Examples of other substances usable as the non-aqueous solvent include chained carbonic acid esters, chained esters, cyclic or chained ethers and the like. Specific examples of the substances usable as the non-aqueous solvent include dimethyl carbonate, diethyl carbonate, methylethyl carbonate, tetrahydrofran, dioxolane, sulfolane, dimethyl formamide, acetonitrile, dimethyl sulfoxide, and the like.

As the support salt, a salt formed of any of the following anions and any of the following cations is usable. Usable anions include halide anion, perchloric acid anion, trifluoromethanesulfonic acid anion, tetrafluoroboric acid anion, hexafluorophosphoric acid anion, trifluoromethanesulfonic acid anion, nonafluoro-1-butanesulfonic acid anion, bis(trifluoromethanesulfonyl)imide anion, bis(perfluoroethylsulfonyl)imide anion, and the like. Usable cations include alkaline metal cations of lithium, sodium, potassium and the like; alkaline earth metal cations of magnesium and the like; quaternary ammonium cations of tetraethylammonium, 1,3-ethylmethylimidazolium and the like.

As the cation, a quaternary ammonium cation or a lithium cation is preferable. A quaternary ammonium cation has a high level of ion mobility and so provides a highly conductive electrolytic solution, and also allows use of a negative electrode having an electric double layer capacity, which is formed of activated carbon or the like having a high reaction rate, as a counter electrode. For these reasons, use of a quaternary ammonium cation realizes a large-output electricity storage device. A lithium cation allows use of a negative electrode, which has a low reaction potential and a high capacity density and is capable of occluding and releasing lithium, as a counter electrode. For these reasons, use of a lithium cation realizes a high voltage, high energy density electricity storage device.

Figure 2:
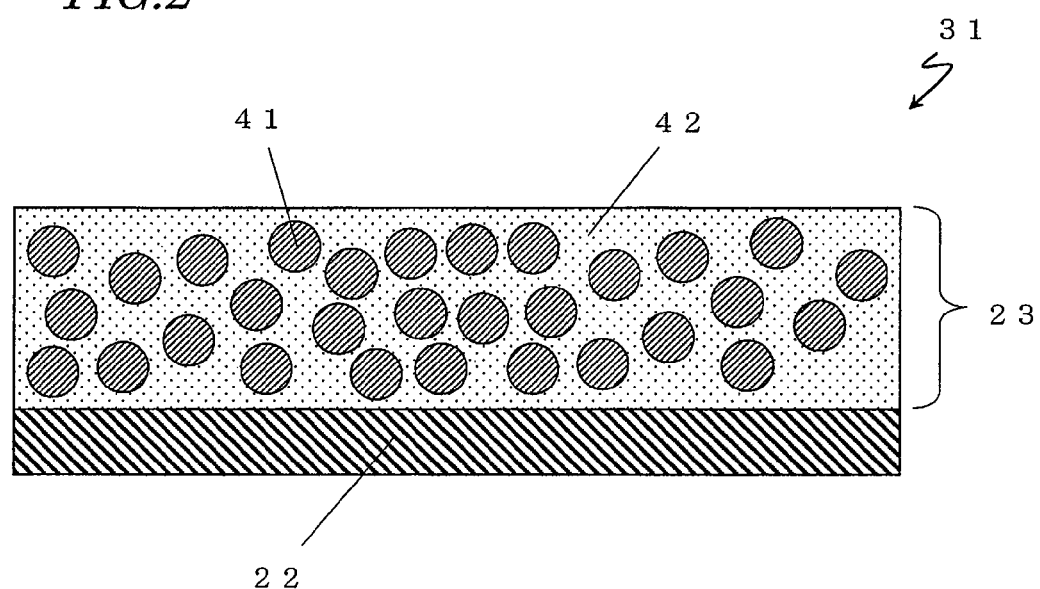
FIG. 2 is a cross-sectional view showing a structure of a positive electrode of the electricity storage device shown in FIG. 1.

FIG. 2 is an enlarged cross-sectional view schematically showing a structure of the positive electrode 31. The positive electrode active substance layer 23 supported by the positive electrode current collector 22 contains positive electrode active substance particles 41 and a conductive agent portion 42 formed of a conductor and a binder. The conductive agent portion 42 is porous so as to hold the electrolytic solution 29. In FIG. 2, the positive electrode active substance particles 41 are schematically shown as being circular, but each positive electrode active substance particle 41 has a shape of a polymer chain folded and aggregated. By the polymer chain being folded, hollow holes are formed to allow the electrolytic solution 29 to enter the inside of the particle. The positive electrode active substance particle 41 has a generally spherical shape, but there is no specific limitation on the shape of the positive electrode active substance particle 41 as long as the shape is formed by the polymer chains being aggregated. The size of the positive electrode active substance particle 41 is about 1 μm to 10 μm.

An electricity storage device in this embodiment contains a polymer, which contains a tetrachalcogenofulvalene structure in a repeat unit of a main chain thereof, as an electricity storage material. The tetrachalcogenofulvalene is polymerized via acetylene and a phenyl group (—C≡C-Ph-C≡C—). Therefore, such an electricity storage material, even though being formed of an organic compound, has a large molecular weight, a low solubility in an organic solvent, and a good oxidation/reduction characteristic. For these reasons, the electricity storage material according to the present invention can realize a good cycle characteristic in an electricity storage device using an organic solvent as the electrolytic solution. Since the tetrachalcogenofulvalene structures are contained in the main chain of the polymer, a site which is subjected to an oxidation/reduction reaction contributes to the increase of the molecular weight of the polymer. Therefore, a polymer structure, in which a portion not subjected to the oxidation/reduction reaction is as small as possible, can be formed. Owing to this, the electricity storage material according to the present invention has a high energy density and a superb charge/discharge or oxidation/reduction cycle characteristic. Because of such features, the electricity storage device according to the present invention is preferably usable for vehicles such as hybrid vehicles or mobile electronic devices. A vehicle or a mobile electronic device including an electricity storage device according to the present invention has features that the electricity storage device is lightweight, provides a large output and has a long cycle life. Thus, the electricity storage device according to the present invention realize weight reduction, which is difficult to be realized with a conventional electricity storage device using an inorganic compound.

Hereinafter, examples of synthesizing a polymer according to the present invention, examples of producing an electricity storage device according to the present invention, and evaluation of characteristics thereof will be described. Unless otherwise described, the reagents were produced by Aldrich and were used as they were.

EXAMPLE 1

Hereinafter, examples of synthesizing a polymer according to the present invention will be described.

1. Synthesis of poly(4,4'-diphenyltetrathiafulvalene)-(1,3-diethinylbenzene) copolymer (compound 7)

A substance represented by general formula (3) in which X is S and R1 and R2 are each a phenyl group, namely, poly(2,6-diphenyltetrathiafulvalene)-(1,3-diethinylbenzene) copolymer (compound 7), was synthesized by: synthesizing precursor compound 8 as shown by the following formula (R3), and then coupling the obtained compound 8 and compound 9. Hereinafter, the synthesis method will be described.

[Chemical formula 12]

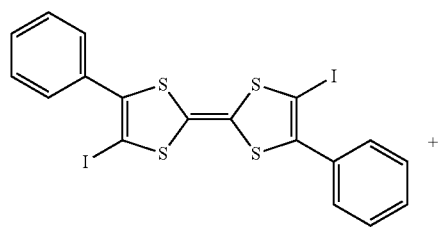

(R3)

8

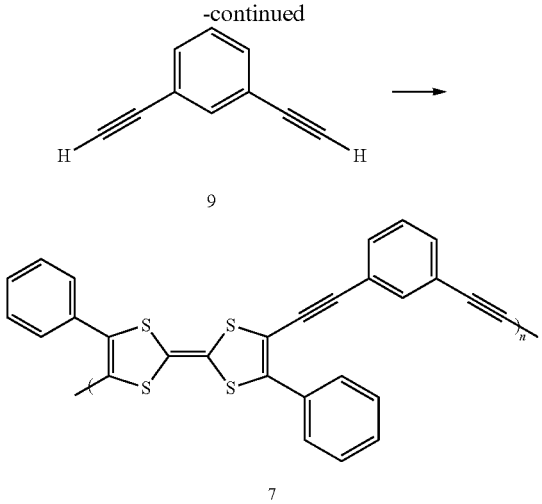

7

1.1 Synthesis of compound 8 (4,4'-diiodine-5,5'-diphenyltetrathiafulvalene)

Compound 8 was synthesized in accordance with the following formula (R4).

[Chemical formula 13]

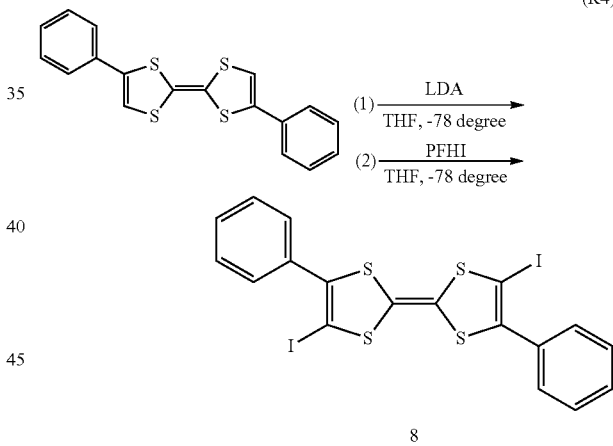

Under a nitrogen atmosphere, 2.8 ml of diisopropylamine and 15 ml of THF were put into a 50 ml Schlenk tube and kept at −78° C. 13.7 ml of butyllithium was added thereto, and these substances were stirred for about 1 hour to synthesize lithium diisopropylamide (LDA). Next, under a nitrogen gas flow, 3.0 g of 4,4'-diphenyltetrathiafulvalene (produced by Aldrich) was put into a 100 ml Schlenk tube and dissolved in 25 ml of THF at −78° C. The resultant substance was kept at −78° C. To the resultant solution, LDA produced above was slowly dropped, and these substances were stirred for 30 minutes. Then, 9.33 g of perfluorohexyldiiodine (4.5 ml) was dropped thereto. These substances were stirred for 1 hour, and then for another hour at room temperature. After the reaction, distilled water was added to stop the reaction. Then, the resultant substance was filtrated, washed and recrystallized. As a result, a red needle-like crystal was obtained. The yield was 52%.

The structure of the obtained compound was identified by H-NMR (CDCl$_3$) and IR measurement (KBr method). As a result of the H-NMR, a chemical shift derived from a phenyl group was observed around 7.4-7.5 ppm. As a result of the IR measurement, a peak derived from C—H stretching vibration was observed around 3052 cm$^{-1}$. An element analysis showed the following results. The theoretical values were: carbon: 35.53, hydrogen: 1.64, sulfur: 21.05, and iodine: 41.78 wt. %; whereas the experimental values were: carbon: 35.43, hydrogen: 1.68, sulfur: 22.79, and iodine 37.77 wt. %. From the above results, the obtained powder was confirmed to be compound 8.

1.2 Synthesis of Compound 7

Under a nitrogen atmosphere, 0.7 g (1.5 mmol) of the synthesized compound 8 was put into a 30 ml Schlenk tube, and 30 ml of THF was added thereto. 10.95 mg (0.0575 mmol) of copper iodide was added thereto, and 66.4 mg (0.0575 mmol) of tetrakis(triphenylphosphine) palladium (hereinafter, Pd(PPh$_3$)$_4$), 1 ml were added thereto, and these substances were stirred. To the resultant solution, 0.0145 g (1.15 mmol) of 1,3-diethinylbenzene, which is compound 9, and 1 ml of triethylamine were added, and these substances were stirred at 60° C. for 24 hours. As a result, the resultant substance was filtrated, and the resultant product was washed with 1 N aqueous solution of hydrochloric acid and ethanol and dried. As a result, a reddish brown powder was obtained. The yield was 62%.

The structure of the synthesized polymer was identified by GPC molecular weight analysis and IR measurement. As a result of performing an IR measurement (KBr method) on the obtained powder, peaks were observed around 692, 755, 793, 1031, 1076, 1442, 1473, 1595, and 2960 cm$^{-1}$. C—H stretching vibration derived from TTF structure was confirmed around 800 to 650 cm$^{-1}$.

From the GPC measurement of the obtained powder, the obtained product was found to have three molecular weight distributions. The respective peak molecular weight values in these distributions were 37670, 1200 and 680 as converted into polystyrene. From the results of the IR measurement and the like, the obtained product was conjectured to have a unit structure represented as compound 7 but to contain low polymers. This product containing the low polymers was labeled as compound 7'.

Compound 7' was purified in order to remove the low polymers. 17 mg of product 7' was dissolved in 7 g of N-methylpyrrolidone, and the resultant substance was dropped to 100 g of ethanol to cause reprecipitation. The molecular weight distribution of the obtained product was measured. The molecular weight distribution showed no peak in the range of 2000 or lower, and the molecular weight was distributed in a region of about 2000 to 100000. The peak molecular weight was 38000. This product was labeled as compound 7.

2. Synthesis of poly(4,4'-dimethyltetrathiafulvalene)-(1,3-diethinylbenzene) copolymer (compound 10)

A substance represented by general formula (3) in which X is S and R1 and R2 are each a methyl group, namely, poly(4,4'-dimethyltetrathiafulvalene)-(1,3-diethinylbenzene) copolymer (compound 10), was synthesized by: synthesizing precursor compound 11 as shown by the following formula (R5), and then coupling the obtained compound 11 and compound 9. Hereinafter, the synthesis method will be described.

[Chemical compound 14]

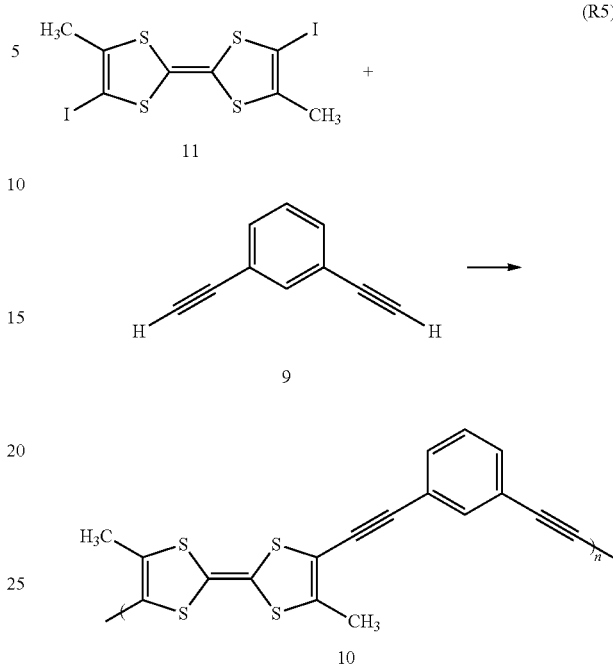

2.1 Synthesis of compound 11 (4,4'-diiodine-5',5-dimethyltetrathiafulvalene)

Compound 11 was synthesized in accordance with the following formula (R6).

[Chemical compound 15]

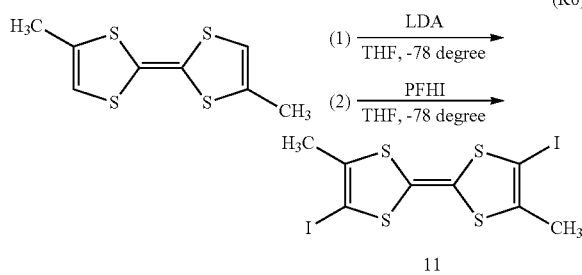

2.6 M n-butyllithium (0.6 ml, 1.56 mmol) was dropped at −78° C. to a THF solution having isopropylamine (1.43 g, 24 mmol) dissolved therein. After these substances were stirred for 10 minutes, dimethyltetrathiafulvalene (0.10 g, 0.43 mmol) was added thereto at −78° C. As a result, the transparent solution was changed to an ocherous suspension. After the resultant substance was stirred for 10 minutes, C$_6$F$_{13}$I (3.10 g, 7.0 mmol) was added thereto at −78° C. As a result, the suspension was turned to dark green. After being kept stirred for a while, the suspension was turned to red. After the suspension was stirred at −78° C. for 1 hour, the temperature of the reaction solution was gradually raised to room temperature. The reaction solution was stirred for 4 more hours. Water was added to the reaction solution, and the resultant substance was subjected to extraction with ether. After the ether layer was dried, the solvent was removed. As a result, a dark red solid was obtained. The dark red band portion was recovered using a column (silica, chloroform), and the solvent was removed. As a result, a dark red viscous solid was obtained. Hexane was added to the dark red viscous solid, and the resultant substance was dried. As a result, an orange powder product was obtained. The product was confirmed to be compound 11 (diiodinedimethyltetrathiafulvalene) by H-NMR (CDCl$_3$) and IR measurement (KBr method). The yield was 0.14 g (67%).

2.2 Synthesis of Compound 10

Compound 11 (0.12 g, 0.25 mmol) and 2 ml of triethylamine were dissolved in 10 ml of N-methylpyrrolidone (0.12 g, 0.25 mmol), and the resultant substance was subjected to nitrogen bubbling for 10 minutes. Then, Pd(PPh$_3$)$_4$ (0.060 g, 0.05 mmol), CuI (0.020 g, 0.10 mmol) and 1,3-diethinylbenzene (0.049 g, 0.39 mmol) were added thereto, and these substances were stirred at 100° C. The color of the solution was changed from dark red to dark orange. After the resultant substance was stirred for 24 hours, the reaction solution was put into water. As a result, a blackish red solid was obtained. The solid was stirred and washed with methanol and then acetone, then isolated by a Kiriyama funnel, and naturally dried. As a result, a dark brown product was obtained. The product was confirmed to be compound 10 by H-NMR (CDCl$_3$) and IR measurement (KBr method). The yield was 0.07 g (79%). The peak molecular weight obtained from a GPC measurement was 36484 as converted into polystyrene.

3. Synthesis of poly(4,4'-didecyltetrathiafulvalene)-(1,4-diethinylbenzene) copolymer (compound 14)

A substance represented by general formula (2) in which X is S and R1 and R2 are each a decyl group, namely, poly(4.4'-didecyltetrathiafulvalene)-(1,4-diethinylbenzene) copolymer (compound 14), was synthesized by: synthesizing precursor compound 12 as shown by the following formula (R7), and then coupling the obtained compound 12 and compound 13. Hereinafter, the synthesis method will be described.

[Chemical formula 16]

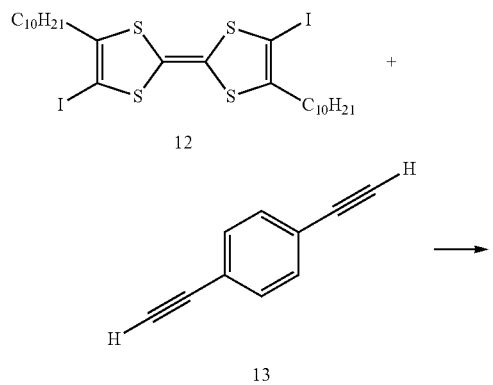

-continued

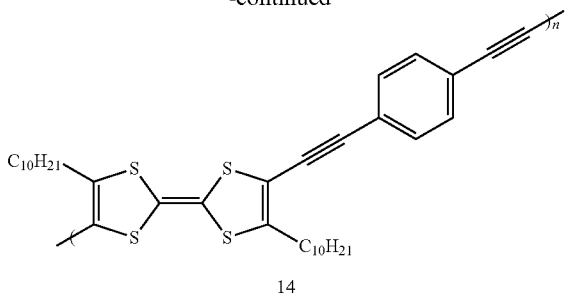

Compound 12 was synthesized in accordance with the following formula (R8).

[Chemical formula 17]

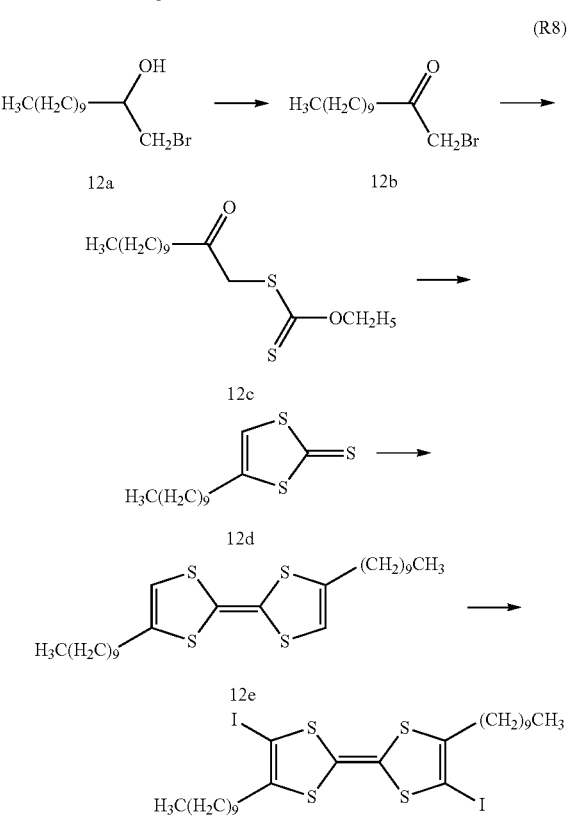

3.1 Synthesis of compound 12a (1-bromo-2-dodecanol)

In a 1000 ml eggplant-shaped flask, 16.9 g of 1-dodecane was dissolved in 350 ml of dimethylsulfoxide (DMSO), and 15 ml of H$_2$O and 54 g of N-bromosuccinimide (NBS) were added thereto. These substances were stirred at room temperature for 4 hours. Then, extraction was caused with ether, the extracted substance was dried, and the solvent was removed at reduced pressure. After the resultant substance was purified, a colorless transparent liquid was obtained. The yield was 59%.

3.2 Synthesis of compound 12b
(1-bromo-2-dodecanone)

In a 1000 ml eggplant-shaped flask, 14 g of compound 12a (1-bromo-2-dodecanol) was dissolved in 110 ml of acetone. 66 ml of distilled water and 15 g of sodium dichromate dihydrate dissolved in advance in 11 ml of sulfuric acid were dropped thereto. These substances were stirred at room temperature for 1.5 hours, and then 250 ml of ether was added thereto. The resultant substance was dehydrated, and the solvent was removed. As a result, a white solid was obtained. The yield was 80%.

3.3 Synthesis of compound 12c
(O-ethyl-1-xanthyldodecane-2-one)

In a 1000 ml eggplant-shaped flask, 9.2 g of compound 12b (1-bromo-2-dodecanone) was dissolved in 400 ml of acetone, and the resultant substance was heated to 50° C. Then, 5.6 g of potassium xanthogenate was added thereto, and these substances were refluxed for 4 hours. After the reflux, the reaction solution was poured to distilled water. Extraction was caused with ether, the extracted substance was dried, and the solvent was removed. As a result, a yellow crystal was obtained. The yield was 45%.

3.4 Synthesis of compound 12d
(4-decyl-1,3-dithiol-2-thione)

In a 1000 ml eggplant-shaped flask, 44 g of compound 12c (O-ethyl-1-xanthyldodecane-2-one) was dissolved in 600 ml of dehydrated toluene, and the resultant substance was heated to a temperature close to the boiling point thereof. Then, 120 g of diphosphorus pentasulfide was added thereto little by little, and these substances were refluxed for about 20 hours. The obtained solution was filtrated. Extraction was caused with ether, the extracted substance was dried, and the solvent was removed. As a result, a red oil-like target substance was obtained. The yield was 63%.

3.5 Synthesis of compound 12e
(2,6-didecyltetrathiafulvalene)

Under a nitrogen gas flow, 3.3 g of compound 12d (4-decyl-1,3-dithiol-2-thione) was put into a 500 ml Schlenk tube and dissolved in 140 ml of acetone. 48 g of m-chloroperoxybenzoic acid dissolved in advance in 210 ml of acetone was dropped thereto, and then these substances were stirred for 30 minutes. After the acetone was removed, the resultant substance was dissolved in 220 ml of methylene chloride. When the substance became uniform, 20 g of sodium hexafluorophosphate was added thereto. These substances were stirred at room temperature for 1 hour, and 200 ml of acetonitrile was added thereto. These substances were stirred for 15 minutes. 56 ml of triethylamine was added thereto, and these substances were stirred for another hour. Then, extraction was caused with ether, the extracted substance was dried, and the solvent was removed. The resultant substance was purified and recrystallized. As a result, an orange powder was obtained. The yield was 22%.

The structure of the synthesized compound was identified by H-NMR (CDCl$_3$), IR measurement and element analysis. As a result of the H-NMR measurement, chemical shifts were observed at 5.62 (derived from Sr—H), 2.27 (derived from α-CH$_2$), 1.53 (derived from β-CH$_2$), 1.29 (derived from —CH$_2$), and 0.88 (derived from —CH$_3$).

As a result of the IR measurement (KBr method), peaks were observed around 3050, 2952, 2920, 2848, and 1500-1300 cm$^{-1}$. The results of the element analysis were as follows. The theoretical values were: carbon: 64.61, hydrogen: 9.15, and sulfur: 26.45 wt. %; whereas the experimental values were: carbon: 64.61, hydrogen: 9.18, and sulfur: 26.40 wt. %. From the above results, the obtained powder was confirmed to be compound 12e.

3.6 Synthesis of compound 12
(2,6-diiodine-3,7-didecyltetrathiafulvalene)

Under a nitrogen gas flow, in a 100 ml Schlenk tube, 1.1 g of compound 12e (2,6-didecyl TTF) was dissolved in 25 ml of THF, and these substances were cooled in a dry ice-methanol bath down to −78° C. Then, 4.4 ml of butyllithium (BuLi) was dropped thereto, and these substances were stirred for 10 minutes. 1.5 ml of perfluorohexyldiiodine (PFHI) was dropped to the reaction solution, and these substances were stirred at −78° C. for 1 hour, and then at room temperature for 1 hour. Then, distilled water was dropped to stop the reaction. Extraction was caused with ether, the extracted substance was dried, and the solvent was removed. The resultant substance was purified and recrystallized. As a result, an orange powder was obtained. The yield was 35%.

The structure of the synthesized compound was identified by H-NMR, IR measurement and element analysis. As a result of the H-NMR measurement, chemical shifts were observed at 2.37 (derived from α-CH$_2$), 1.54 (derived from β-CH$_2$), 1.27 (derived from —CH$_2$), and 0.88 (derived from —CH$_3$). As a result of the IR measurement (KBr method), peaks were observed around 2954, 2916, 2848, and 1500-1300 cm$^{-1}$. The results of the element analysis were as follows. The theoretical values were: carbon: 42.39, hydrogen: 5.75, sulfur: 17.41, and iodine: 34.45 wt. %; whereas the experimental values were: carbon: 42.18, hydrogen: 5.33, sulfur: 17.75, and iodine: 36.00 wt. %. From the above results, the obtained powder was confirmed to be compound 12.

3.7 Synthesis of Compound 14

The obtained precursor compound 12 and commercially available compound 13 were reacted with each other in accordance with formula (R7) by the same method as used for the synthesis of compound 10. Thus, a blackish brown powder was obtained. The yield was 40%.

The structure of the synthesized compound was identified by GPC molecular weight analysis and IR measurement. As a result of performing an IR measurement (KBr method) on the obtained powder, peaks were observed around 692, 755, 793, 1031, 1076, 1442, 1473, 1595, and 2960 cm$^{-1}$. Around 800 to 650 cm$^1$, C—S stretching vibration derived from the TTF structure was confirmed. The peak molecular weight obtained from the GPC measurement of the obtained powder was 23000 as converted into polystyrene. From the above results, the obtained powder was confirmed to be compound 14.

COMPARATIVE EXAMPLE 1

For comparison, compound 15 containing tetrathiafulvalene structures in a side chain instead of the main chain thereof, and compound 16 not containing acetylene or a phenyl group between the tetrathiafulvalene structures, were synthesized.

1. Synthesis of Compound 15

A polymer represented by the following chemical formula (15) (compound 15) was synthesized. The polymer represented by chemical formula (15) (poly-TTF) was synthesized by reacting poly(vinyl alcohol) and a tetrathiafulvalenecarboxyl derivative by dehydration condensation. The weight average molecular weight of compound 15 was about 50000.

[Chemical formula 18]

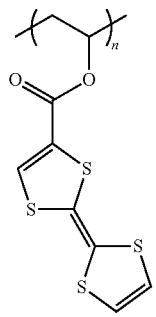

(15)

2. Synthesis of Compound 16

A polymer represented by the following chemical formula (16) (compound 16) was synthesized. The polymer represented by chemical formula (16) was synthesized in accordance with the following reaction formula (R9).

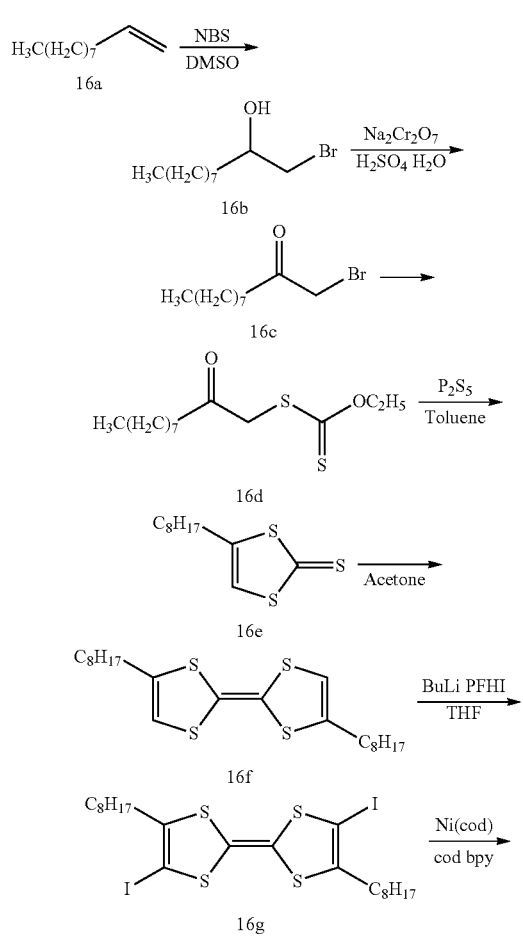

(R9)

-continued

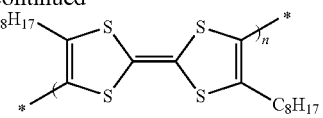

16

2.1 Synthesis of Compound 16b

Decane-1-ene (compound 16a; 126.4 g, 0.09 mol) was put into a 2000 ml eggplant-shaped flask, and DMSO (1500 ml), distilled water (88 ml) and NBS (320 g, 1.8 mol) were added thereto. These substances were stirred for 4 hours. Then, extraction was caused with ether, the extracted substance was dried, and the solvent was removed. The obtained sample was purified by column chromatography using silica gel. As a result, a colorless transparent liquid was obtained. The yield was 98%.

As a result of an H-NMR ($CDCl_3$) measurement, chemical shifts were observed at δ3.76, 3.41, 2.20, 1.58-1.29, and 0.89. As a result of an IR (NaCl liquid film method) measurement, peaks were observed at 3400, 2924, 2854, and 1028 $cm^{-1}$. An element analysis showed the following results. The theoretical values were: carbon: 50.64, hydrogen: 8.92, and bromine: 33.69 wt. %; whereas the experimental values were: carbon: 50.46, hydrogen: 9.06, and bromine: 33.58 wt. %. From the above results, the obtained liquid was confirmed to be compound 16b.

2.2 Synthesis of Compound 16c

Compound 16b (210 g, 860 mmol) was put into a 2000 ml eggplant-shaped flask and dissolved in acetone (900 ml). Sulfuric acid (160 ml) and sodium dichromate dihydrate (260 g, 880 mmol) were dissolved in distilled water (900 ml), and the resultant substance was put into the eggplant-shaped flask. These substances were stirred for 1.5 hours. Then, ether was added, and these substances were stirred for another hour. Extraction was caused with ether, the extracted substance was dried, and the solvent was removed. The obtained sample was purified by column chromatography using silica gel. As a result, a white solid was obtained. The yield was 92%.

As a result of an H-NMR ($CDCl_3$) measurement, chemical shifts were observed at δ3.93, 2.65, 1.65-1.29, and 0.88. As a result of an IR (NaCl liquid film method) measurement, peaks were observed at 2926, 2854, 1718, and 1066 $cm^{-1}$. An element analysis showed the following results. The theoretical values were: carbon: 51.07, hydrogen: 8.14, and bromine: 33.98 wt. %; whereas the experimental values were: carbon: 50.23, hydrogen: 7.67, and bromine: 34.59 wt. %. From the above results, the obtained white solid was confirmed to be compound 16c.

2.3 Synthesis of Compound 16d

Acetone (1400 ml) was put into a 2000 ml eggplant-shaped flask, compound 16c (150 g, 620 mmol) was added thereto, and these substances were heated to 50° C. Potassium xanthogenate (100 g, 620 mmol) was added thereto little by little, and these substances were refluxed for 4 hours. Then, the reaction solution was poured to distilled water. Extraction was caused with ether, the extracted substance was dried, and the solvent was removed. As a result, a yellow transparent liquid was obtained. The yield was 77%.

As a result of an H-NMR (CDCl$_3$) measurement, chemical shifts were observed at δ4.63, 3.99, 2.59, 1.66-1.23, and 0.88. As a result of an IR (NaCl liquid film method) measurement, peaks were observed at 2926, 2854, 1719, and 1049 cm$^{-1}$. An element analysis showed the following results. The theoretical values were: carbon: 56.48, hydrogen: 8.75, and sulfur: 23.20 wt. %; whereas the experimental values were: carbon: 57.86, hydrogen: 9.04, and sulfur: 21.79 wt. %. From the above results, the obtained liquid was confirmed to be compound 16d.

2.4 Synthesis of Compound 16e

Dehydrated toluene (1300 ml) was put into a 2000 ml eggplant-shaped flask, compound 16d (130 g, 450 mmol) was dissolved therein, and the resultant substance was heated to a temperature close to the boiling point thereof. Then, diphosphorus pentasulfide (171 g, 770 mmol) was slowly added thereto, and these substances were refluxed for 20 hours. The obtained solution was filtrated to remove diphosphorus pentasulfide. Extraction was caused with ether, the extracted substance was dried, and the solvent was removed. As a result, a yellow powder was obtained. The yield was 82%.

As a result of an H-NMR (CDCl$_3$) measurement, chemical shifts were observed at δ6.62, 2.59, 1.60-1.25, and 0.88. As a result of an IR (NaCl liquid film method) measurement, peaks were observed at 3040, 2924, 2852, and 1062 cm$^{-1}$. An element analysis showed the following results. The theoretical values were: carbon: 53.61, hydrogen: 7.36, and sulfur: 39.03 wt. %; whereas the experimental values were: carbon: 54.42, hydrogen: 6.76, and sulfur: 39.13 wt. %. From the above results, the obtained powder was confirmed to be compound 16e.

2.5 Synthesis of Compound 16f

Under a nitrogen gas flow, compound 16e (3.1 g, 12 mmol) was put into a 500 ml Schlenk tube and dissolved in 140 ml of acetone. The resultant substance was kept at a temperature of 20° C. m-chlorobenzoic acid (48 g, 300 mmol) dissolved in advance in acetone (210 ml) was dropped thereto, and these substances were stirred for 30 minutes. After the acetone was removed, the resultant substance was dissolved in methylene chloride (220 ml). Sodium hexafluorophosphate (20 g, 120 mmol) was added thereto. After these substances were stirred at room temperature for 1 hour, acetonitrile (200 ml) was added thereto, and these substances were stirred for 15 minutes while the temperature was kept at 20° C. Triethylamine (56 ml) was added, and these substances were stirred for another hour. Then, extraction was caused with ether, the extracted substance was dried, and the solvent was removed. As a result, an orange powder was obtained. The yield was 23%.

As a result of an H-NMR (CDCl$_3$) measurement, chemical shifts were observed at δ6.34, 2.36, 1.44, 1.24, and 0.84. As a result of an IR (KBr method) measurement, peaks were observed at 3050, 2922, 2850, and 1500-1300 cm$^{-1}$. An element analysis showed the following results. The theoretical values were: carbon: 61.62, hydrogen: 8.46, and sulfur: 29.91 wt. %; whereas the experimental values were: carbon: 61.90, hydrogen: 8.52, and sulfur: 30.19 wt. %. From the above results, the obtained powder was confirmed to be compound 16f.

2.6 Synthesis of Compound 16 g

Under a nitrogen gas flow, compound 16f (0.99 g, 2.3 mmol) was put into a 100 ml Schlenk tube and dissolved in THF (25 ml). The resultant substance was cooled down to −78° C. Butyllithium (4.4 ml, 1.53 mol/L hexane solution) was dropped thereto by a syringe, and these substances were stirred for 10 minutes. Then, perfluorohexyliodine (PFHI; 1.5 ml) was dropped thereto, and these substances were stirred at −78° C. for 1 hour, and then at room temperature for 1 hour. Distilled water was added to stop the reaction. Then, extraction was caused with ether, the extracted substance was dried, and the solvent was removed. The resultant substance was recrystallized with hexane. As a result, an orange powder was obtained. The yield was 40%.

As a result of an H-NMR (CDCl$_3$) measurement, chemical shifts were observed at δ2.42, 1.53, 1.27, and 0.89. As a result of an IR (KBr method) measurement, peaks were observed at 2952, 2922, 2852, and 1500-1300 cm$^{-1}$. An element analysis showed the following results. The theoretical values were: carbon: 38.83, hydrogen: 8.46, and sulfur: 18.85 wt. %; whereas the experimental values were: carbon: 39.13, hydrogen: 4.93, and sulfur: 19.44 wt. %. From the above results, the obtained powder was confirmed to be compound 16 g.

2.7 Synthesis of Compound 16

Under a nitrogen gas flow, Ni(cod)2 (0.28 g, 1.0 mmol) and 1,5-cod (0.11 g, 1.0 mmol) were put into a 50 ml Schlenk tube and dissolved in 7 ml of DMF. 2,2'-bipyridine (0.19 g, 1.2 mmol) was added thereto. After it was confirmed that the solution turned purple, compound 16 g (0.46 g, 0.67 mmol) was added thereto. These substances were stirred at 50° C. for 24 hours, and then the reaction solution was directly put to methanol. The obtained powder was washed, filtrated, reprecipitated using methanol, and dried. As a result, a brown powder was obtained.

The number average molecular weight (Mn) was 3600. An element analysis showed the following results. The theoretical values were: carbon: 58.16, hydrogen: 8.21, and sulfur: 28.24 wt. %; whereas the experimental values were: carbon: 56.31, hydrogen: 6.96, and sulfur: 26.99 wt. %. From the above results, the obtained powder was confirmed to be compound 16.

EXAMPLE 2

Electricity storage devices according to the present invention was produced, and characteristics thereof were evaluated. Hereinafter, the results will be described.

1. Production of Electrodes for Electricity Storage Devices and Evaluation of the Characteristics Thereof 1.1 Production of Electrodes for Electricity Storage Devices Electrodes as examples of the present invention were produced using compounds 7, 7', 10 and 14. Compound 7 was mixed after being pulverized with a mortar. After being pulverized with the mortar, compound 7 had a particle diameter of about 10 μm. 37.5 mg of compound 7 and 100 mg of acetylene black as a conduction assisting agent were uniformly mixed. 25 mg of polytetrafluoroethylene as a binder was further added thereto, and these substances were mixed to form a paste. The obtained paste was pressure-contacted on an aluminum wire net, vacuum-dried, and punched into a disc having a diameter of 13.5 mm to produce an electrode film. The weight of the polymer compound which was applied per unit area size was 1.0 mg/cm². In a similar manner, electrodes were produced using compounds 7', 10 and 14. Hereinafter, electrodes produced using compounds 7, 7', 10 and 14 will be referred to as electrodes A, A' B and C, respectively.

Electrodes D and E as comparative examples were produced respectively using compounds 15 and 16 by a similar method to the method used for producing electrode A as an example according to the present invention.

1.2 Evaluation of Electrodes

Electrodes A, A', B and C and comparative example electrodes D and E were subjected to an evaluation of electrochemical stability against an oxidation/reduction reaction. Cells to be evaluated in terms of stability were produced as follows. Electrodes A, A', B and C and comparative example electrodes D and E were each used as a working electrode. For each of a counter electrode and a reference electrode, lithium metal was used. These electrodes were located in a beaker cell immersed in an electrolytic solution. The electrolytic solution was obtained by dissolving lithium hexafluorophosphate as a support electrolyte salt in propylene carbonate (PC) as a solvent. The concentration was adjusted to 1 mol/L.

Each cell was scanned within a range of potentials of 3.0 V to 4.0 V with respect to Li as the reference. The scanning was performed 10 times in a noble direction from the immersion potential at a sweep rate of 0.05 mV/sec. The stability was evaluated based on a comparison value of the sweeping results obtained at the third scanning and the sweeping results obtained at the tenth scanning. The third scanning was used as the basis in order to eliminate the influence of gas adsorbed to the surface of the electrode and of oxygen dissolved in the electrolytic solution and thus obtain stable data. The values of potentials described below are all with respect to Li unless otherwise specified.

As a result of the evaluation, electrodes A, A', B and C and comparative example electrodes D and E exhibited two-stage oxidation/reduction current peaks derived from the TTF structures. Thus, these electrodes were confirmed to have oxidation/reduction activity.

With comparative example electrode D, the peak current values at the tenth cycle were lower by 20% than those at the third cycle. From this, it is considered that the oxidation/reduction activity of comparative example electrode D was decreased by 20%, and that comparative example electrode D is not high in stability.

By contrast, with electrodes A, A', B and C and comparative example electrode E, the peak current values of the third cycle matched the peak current values of the tenth cycle. This is considered to show that the polymers according to the present invention are not decomposed or deactivated by oxidation/reduction and have a high stability against the oxidation/reduction reaction, and furthermore, are not eluted into the electrolytic solution.

From the above, it is understood that the polymers according to the present invention maintain a good oxidation/reduction characteristic of tetrathiafulvalene and also suppress elution into the electrolytic solution, and so are suitable as an electrode active substance.

2. Production and Evaluation of Electricity Storage Devices

Next, electricity storage devices were produced and evaluated.

2.1 Production of Electricity Storage Devices

Electrodes A, A', B and C and comparative example electrodes D and E were each used as a positive electrode, and metal lithium (thickness: 300 μm) was used for a negative electrode. Lithium metal (thickness: 300 μm) was punched into a disc having a diameter of 15 mm and pasted on a disc-shaped current collector (formed of stainless steel) having a diameter of 15 mm to produce a negative electrode.

The electrolytic solution was produced by dissolving lithium hexafluorophosphate as a support electrolytic salt in propylene carbonate (PC) as a solvent. The concentration was adjusted to 1 mol/L. A porous polyethylene sheet having a thickness of 20 μm was used as a separator. The positive electrode, the negative electrode and the separator were impregnated with the electrolytic solution. The positive electrode, the negative electrode and the separator were accommodated in a case of a coin-type battery having a structure described above in EMBODIMENT 2 and held between sealing plates provided with a gasket. The resultant assembly was caulked and sealed by a press. Thus, coin-type electricity storage devices were obtained. Electricity storage devices obtained using electrodes A, A', B and C and comparative example electrodes D and E each as a positive electrode were labeled as electricity storage devices A1, A1', B1 and C1 and comparative example electricity storage devices D1 and E1, respectively.

2.2 Evaluation of Electricity Storage Devices

Figure 3:
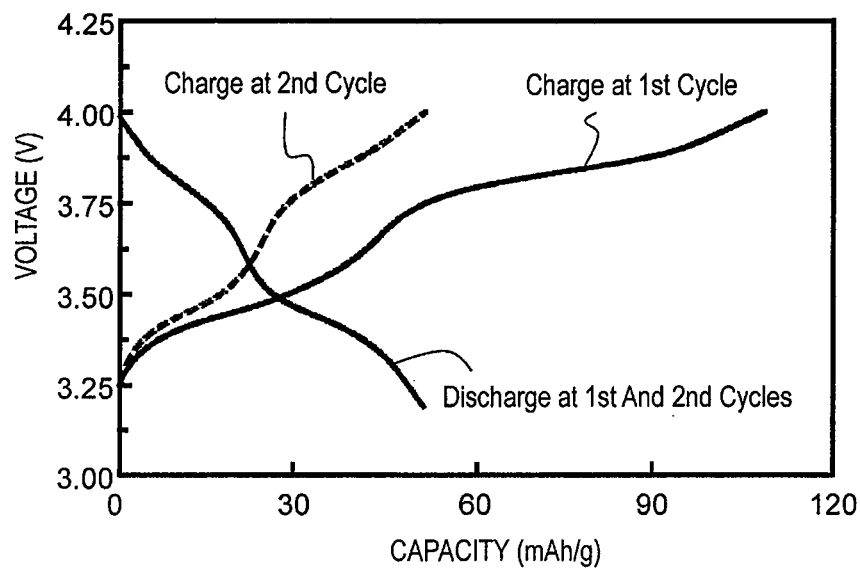
FIG. 3 shows charge/discharge curves of electricity storage device A1' as an example of the present invention.
Figure 4:
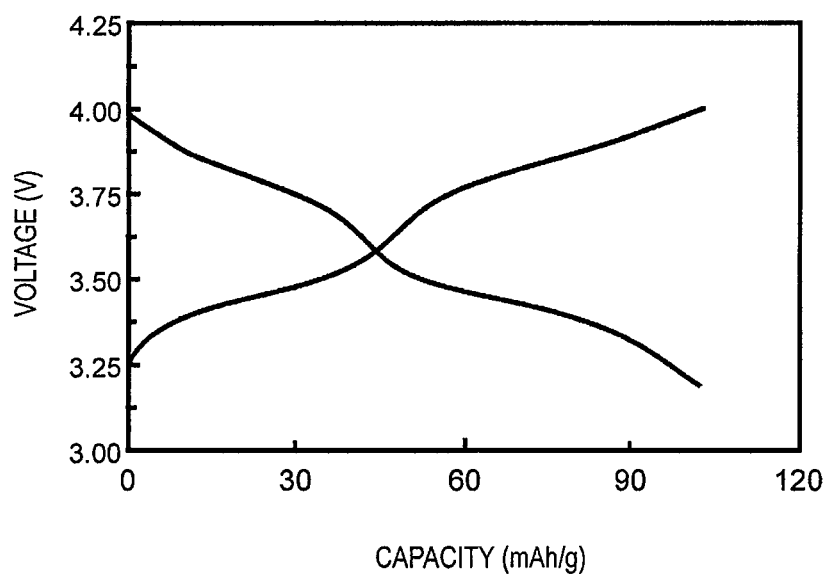
FIG. 4 shows charge/discharge curves of electricity storage device A1 as an example of the present invention.
Figure 5:
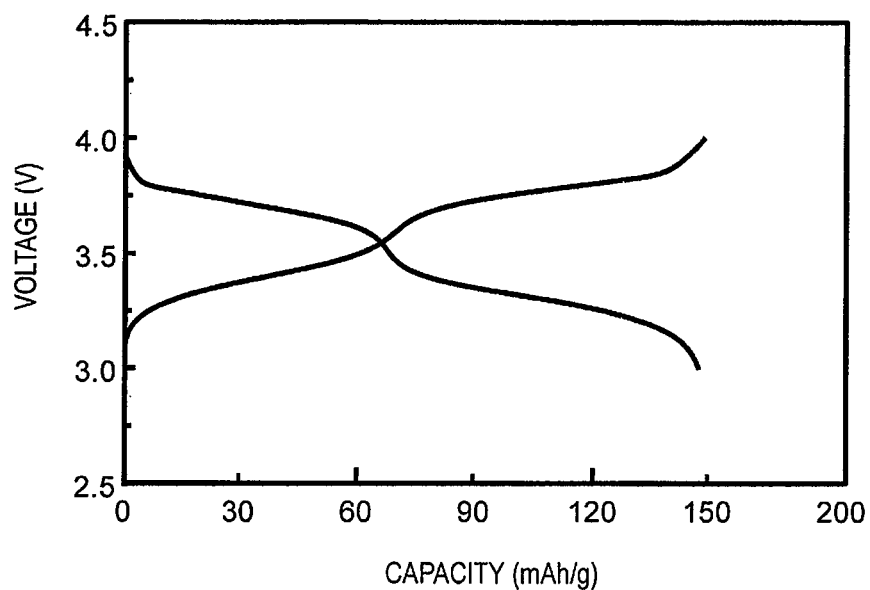
FIG. 5 shows charge/discharge curves of electricity storage device B1 as an example of the present invention.
Figure 6:
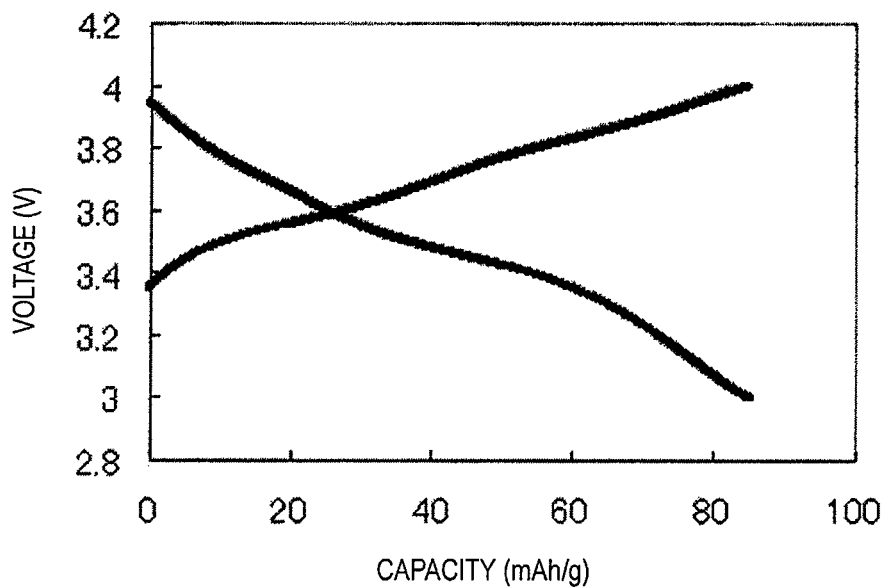
FIG. 6 shows charge/discharge curves of electricity storage device C1 as an example of the present invention.

For the capacity evaluation and cycle characteristic evaluation of the electricity storage devices, a region of potentials at which each material can be oxidized/reduced was set as a charge/discharge voltage range. Specifically, for electricity storage devices A1 and A1', the voltage range was from the upper limit of charge voltage of 4 V to the lower limit of discharge voltage of 3.2 V. For electricity storage device B1, the voltage range was from the upper limit of charge voltage of 4.0 V to the lower limit of discharge voltage of 3.2 V. For electricity storage devices C1 through E1, the voltage range was from the upper limit of charge voltage of 4.0 V to the lower limit of discharge voltage of 3.0 V. The charge/discharge operation was performed at a constant current of 0.1 mA. The pause time after the charge and before the start of discharge was set to zero. This charge/discharge operation was performed by 50 cycles. FIG. 3 shows charge/discharge curves of electricity storage device A1' at the first through second cycles. FIGS. 4, 5 and 6 respectively show charge/discharge curves of electricity storage devices A1, B1 and C1 at the third cycle.

The capacity of each electricity storage device was evaluated based on the value obtained by dividing the discharge capacity at the third cycle of the charge/discharge operation by the weight of the active substance, namely, based on the discharge capacity per unit weight of the active substance. The ratio of the discharge capacity of the active substance at the third cycle of the charge/discharge operation with respect to the theoretical discharge capacity of the active substance is calculated as a utilization factor and represented with the percentage. The cycle characteristic of each electricity storage device was evaluated based on the discharge capacity maintaining ratio, namely, the ratio of the discharge capacity at the 50th cycle with respect to the discharge capacity at the third cycle. Table 1 shows the results of the capacity evaluation and the cycle characteristic evaluation on electricity storage devices A1, B1 and C1 and comparative example electricity storage devices D1 and E1.

TABLE 1

|  |  | Theoretical capacity [mAh/g] | Discharge capacity [mAh/g] | Utilization factor [%] | Capacity maintaining ratio [%] 3rd cycle | 50th cycle |
|---|---|---|---|---|---|---|
| Example | Electricity storage device A1 (compound 7) | 105 | 104 | 99 | 100 | 100 |
|  | Electricity storage device B1 (compound 10) | 150 | 150 | 100 | 100 | 99 |
|  | Electricity storage device C1 (compound 14) | 88 | 84 | 95 | 100 | 98 |
| Comparative example | Electricity storage device D1 (compound 15) | 180 | 150 | 80 | 100 | 40 |
|  | Electricity storage device E1 (compound 16) | 126 | 75 | 60 | 100 | 98 |

As a result of the experiments, it was confirmed that as shown in FIG. 3, with electricity storage device A1', the charge reaction proceeded at potentials around 3.6 V and 3.8 V and the discharge reaction occurred at potentials around 3.7 V and 3.3 V. However, at the first cycle, the discharge capacity was decreased to about 50% with respect to the charge capacity. At the second cycle, the charge capacity and the discharge capacity were almost the same.

Compound 7' used for electricity storage device A1' has three molecular weight distributions, and contains low polymers having a peak molecular weight of about 1200 and 680 in a region of 2000 or less and a polymerization degree of about 1 to 3. The significant capacity decrease of the electricity storage device at the first cycle is considered to have occurred because these low polymers were dissolved in the electrolytic solution and eluted to the outside of the electrode and so the amount of the positive electrode active substance was reduced.

At the second cycle, neither the charge capacity nor the discharge capacity was decreased, and the charge capacity at the second cycle substantially matched the discharge capacity at the second cycle. From this, it is considered that the low polymers were eluted almost entirely at the first cycle and the polymer portions which had not been eluted were not decomposed or the like, and thus a good cycle characteristic was exhibited.

As shown in FIG. 4, with electricity storage device A1 using compound 7 deprived of low polymers, such a capacity change at the first cycle was not exhibited. From this, it was found that a polymer having a peak molecular weight of 37670 was not eluted into the electrolytic solution. The molecular weight of compound 7 is distributed in a region of about 2000 to 100000, and the molecular weight of the repeat unit of compound 7 is about 500. Therefore, compound 7 is conjectured to be at least a tetramer. From this, it is understood that the polymerization degree of the polymers according to the present invention is preferably 4 or greater in order to suppress the dissolution thereof in the electrolytic solution.

Similarly as shown in FIGS. 4 through 6, with electricity storage devices A1, B1 and C1 as examples of the present invention, it was confirmed that the charge reaction proceeded at potentials around 3.6 V and 3.8 V and the discharge reaction occurred at potentials around 3.7 V and 3.3 V. The discharge capacities were 84 to 150 mAh/g, and it was found that electricity storage devices A1, B1 and C1 had a large discharge capacity. From the operating voltage and the discharge capacity, it is considered that a large-capacity, large-output electricity storage device can be realized by using a polymer according to the present invention.

The capacity maintaining ratio of electricity storage device A1 at the 50th cycle was 100%, and the capacity maintaining ratios of electricity storage devices B1 and C1 at the 50th cycle were 99% and 98%, respectively. From these results, it is understood that the capacity of electricity storage devices A1, B1 and C1 was not decreased almost at all after a number of cycles as small as 50, and so electricity storage devices A1, B1 and C1 have a superb cycle characteristic. This is considered to be caused by a superb stability of the polymers according to the present invention against oxidation/reduction.

The discharge capacities of electricity storage devices A1, B1 and C1 at the third cycle are 84 mAh/g to 150 mAh/g, and so are relatively widely diversified. This is because the discharge capacity per unit mass of each compound relies on the molecular weight of each substituent of the tetrathiafulvalene structure.

Specifically, in compound 10 of electricity storage device B1, the substituent of the tetrathiafulvalene structure is a methyl group, which has a relatively small molecular weight. Therefore, the discharge capacity at the third cycle is as large as 150 mAh/g. By contrast, in compound 7 of electricity storage device A1 and compound 14 of electricity storage device C1, the respective substituents are a phenyl group and a decyl group, which have a relatively large molecular weight. Therefore, the discharge capacity at the third cycle is smaller than those of the comparative examples.

However, with comparative example electricity storage device D1, the capacity maintaining ratio is drastically decreased at the 50th cycle, and so the discharge capacity at the 50th cycle is 60 (150×0.4) mAh/g. By contrast, the discharge capacities of electricity storage devices A1 and C1 at the 50th cycle are respectively 104 (104×1) mAh/g and 82.3 (84×0.98) mAh/g, which exceed the values of the comparative examples. Thus, it is understood that electricity storage devices A1 and C1 as examples of the present invention have a superb cycle characteristic and can maintain the high discharge capacity for a long time.

Compound 15 of comparative example electricity storage device D1 has a molecular structure significantly different from that of the polymers according to the present invention. The tetrachalcogenofulvalene structures exist in a side chain instead of the main chain thereof. The cycle characteristic of comparative example electricity storage device D1 and those of electricity storage devices A1 through C1 according to the present invention are only different in the molecular structure of the active substance. Therefore, it was confirmed that by using a polymer according to the present invention, an electricity storage device having an improved stability against repeated charge/discharge, which is the object of the present invention, can be realized.

The polymer of compound 16 of comparative example electricity storage device E1 is similar to a polymer according to the present invention in having tetrachalcogenofulvalene structures in the main chain. However, compound 16 of comparative example electricity storage device E1 is different from the polymer according to the present invention in the molecular structure because in compound 16 of comparative example electricity storage device E1, tetrachalcogenofulvalene structures are directly bonded to each other, instead of the tetrachalcogenofulvalene structure being polymerized via acetylene and a phenyl group (—C≡C-Ph-C≡C—).

The theoretical capacity of comparative example electricity storage device E1 is as large as 126 mAh/g, but the actually obtained discharge capacity was 75 mAh/g. The utilization factor was merely 60%. By contrast, the utilization factors of electricity storage devices A1 through C1 according to the present invention were as high as 95 to 100%. From these results, it was confirmed that polymer molecules, even being the same in containing tetrachalcogenofulvalene structures in a main chain thereof, may provide significantly different device characteristics depending on the molecular structure when being used for the electricity storage devices. It was also confirmed that the polymers according to the present invention have a superb molecular structure which contains a tetrachalcogenofulvalene structure polymerized via acetylene and a phenyl group (—C≡C-Ph-C≡C—) and so provides a high utilization factor with respect to the theoretical value of the charge/discharge capacity.

As described above, an electrode and an electricity storage device according to the present invention exhibit a good cycle characteristic. Such a good cycle characteristic is conjectured to be provided by a polymer structure in which TTF structures are bonded to each other via a (—C≡C-Ph-C≡C—) site. By decreasing the molecular weight of the substituent of the tetrathiafulvalene structure, the discharge capacity per unit mass can be increased. It has been found that according to the present invention, a lightweight, large-capacity electricity storage device can be realized.

3. Production and Evaluation of Other Electricity Storage Devices

Electricity storage devices having a different structure from that of the above-described electricity storage devices were produced and evaluated.

3.1 Production of Electricity Storage Devices

Figure 7:
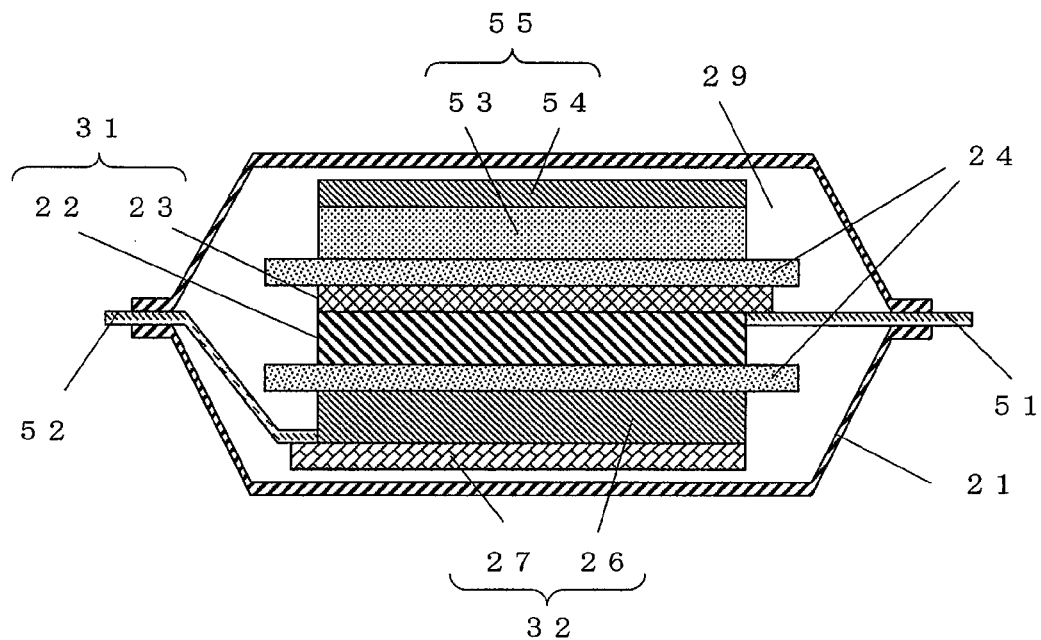
FIG. 7 is a schematic cross-sectional view showing a laminate-type electricity storage device as an embodiment of an electricity storage device in an example of the present invention.
Figure 8:
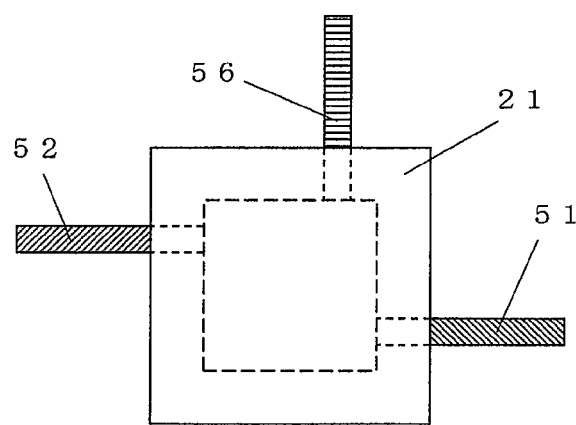
FIG. 8 is a schematic plan view showing the laminate-type electricity storage device, seen from right above, as an embodiment of an electricity storage device in an example of the present invention.

FIG. 7 and FIG. 8 are respectively a schematic cross-sectional view and a schematic plan view of the produced laminate-type lithium secondary battery.

As shown in FIG. 7, the laminate-type lithium secondary battery includes a positive electrode 31, a negative electrode 32 and a reference electrode 55 and separators 24. The positive electrode 31 includes a positive electrode active substance layer 23 and a positive electrode current collector 22. The negative electrode 32 includes a negative electrode active substance layer 26 and a negative electrode current collector 27. The reference electrode 55 includes a reference electrode active substance 53 and a reference electrode current collector 54. The positive electrode current collector 22, the negative electrode current collector 27, and the reference electrode current collector 54 are connected to a positive electrode lead 51, a negative electrode lead 52 and a reference electrode lead 56, respectively.

The positive electrode 31 and the negative electrode 32 are located such that the positive electrode active substance layer 22 and the negative electrode active substance layer 26 face each other while sandwiching, and being in contact with, the separator 24. The reference electrode 55 is located such that the reference electrode active substance 53 and the positive electrode current collector 22 face each other while sandwiching the separator 24. Thus, the positive electrode 31, the negative electrode 32 and the reference electrode 55 form an electrode group. The separators 24 are formed of a porous polyethylene sheet. The leads connected to the respective current collectors are taken outside in different directions so as not to cause a shortcircuit when the electrode group is assembled.

The electrode group is accommodated in a space inside an aluminum laminate case 21. Into the space inside the case 21, an electrolytic solution 29 is injected. The positive electrode 31, the negative electrode 32, the reference electrode 55 and the separators 24 are impregnated with the electrolytic solution 29. The separators 24 include tiny spaces for holding the electrolytic solution 29. Therefore, the electrolytic solution 29 is held in the tiny spaces, and thus is located between the positive electrode 31 and the negative electrode 32 and also between the positive electrode 31 and the reference electrode 55. After the electrode group is placed in the case 21 and the electrolytic solution is injected thereinto, the case 21 is sealed by heated sealing.

In this example, electrodes A, B and C and comparative example electrode E were each used as a positive electrode. An activated carbon electrode was used as a negative electrode. For the reference electrode, metal lithium (thickness: 300 μm) was used. Thus, electricity storage devices A2, B2 and C2 as examples of the present invention and comparative example electricity storage device E2 were obtained.

Specifically, for the positive electrode, a positive electrode plate was produced in substantially the same manner as in Example 1 except that each of electrodes A, B and C and comparative example electrode E was punched into a square having a size of 15 mm×15 mm. For the positive electrode lead 51, an aluminum net used for the positive electrode current collector 23 was used.

The negative electrode was produced as follows. As the negative electrode active substance, active carbon powder (specific surface area size: 1700 m$^2$/g; average particle diameter: 2 μm) was used. 100 mg of the activated carbon powder and 20 mg of acetylene black were uniformly mixed, and 20 mg of polyvinyl pyrrolidone and 800 mg of methanol were added thereto. Thus, a slurry was prepared. This slurry-type negative compound was applied on an aluminum foil used as a current collector and vacuum-dried. The resultant substance was punched and cut into a square having a size of 15 mm×15 mm. Thus, the negative electrode was obtained. The weight of the negative electrode active substance applied per unit area size of the electrode plate was 3.0 mg/cm$^2$. For the negative electrode 52, an aluminum foil used for the negative electrode current collector 27 was used.

The reference electrode was produced by punching metal lithium (thickness: 300 μm) into a square having a size of 15 mm×15 mm and pasting the metal lithium to a square nickel current collector having a size of 15 mm×15 mm. For the reference electrode lead 26, a nickel plate used for the reference electrode current collector 54 was used.

Ethylene carbonate (EC) and ethylmethyl carbonate (EMC) were mixed at a volume ratio of 1:3 and used as a solvent. Lithium hexafluorophosphate as a salt was dissolved in the solvent so as to have a concentration of 1 mol/L. Thus, the electrolytic solution was produced. The positive electrode, the negative electrode and the porous polyethylene sheets (thickness: 20 μm) were impregnated with the electrolytic solution.

and the lower limit of the discharge voltage were respectively set to 4.0 V and 3.0 V. The charge/discharge operation at a constant current of 10 mA was repeated by 2000 cycles. The current value of 10 mA is 100 times of 0.1 mA used for the charge/discharge capacity evaluation, and is very large. The charge/discharge rate provided by the current value of 10 mA is high as a test condition. The pause time after the charge and before the start of discharge was set to zero. The above-described charge/discharge capacity evaluation was performed every 1000th cycle, and the obtained discharge capacity was used to calculate the capacity maintaining ratio with respect to the initial discharge capacity represented with the percentage. The results of the experiment are shown in Table 2.

TABLE 2

| | | Initial discharge capacity [mAh/g] | Utilization factor [%] | Capacity maintaining ratio [%] | | |
|---|---|---|---|---|---|---|
| | | | | 3rd cycle | 1000th cycle | 2000th cycle |
| Example | Electricity storage device A2 (compound 7) | 104 | 99 | 100 | 97 | 93 |
| | Electricity storage device B2 (compound 10) | 150 | 100 | 100 | 95 | 90 |
| | Electricity storage device C2 (compound 14) | 84 | 95 | 100 | 94 | 89 |
| Comparative example | Electricity storage device E2 (compound 15) | 75 | 60 | 100 | 80 | 75 |

3.2 Evaluation of the Electricity Storage Devices

As evaluations of electricity storage devices A2, B2 and C2 and comparative example electricity storage device E2, the charge/discharge capacity was evaluated, and then the charge/discharge cycle characteristic was evaluated. In this example, activated carbon having a higher cycle characteristic than that of metal lithium is used for the negative electrode, and so the cycle characteristic for a larger number of cycles can be evaluated.

The charge/discharge capacity evaluation on the electricity storage devices was performed as follows. The upper limit of the charge voltage and the lower limit of the discharge voltage were respectively set to 4.0 V and 3.0 V with respect to the reference electrode. The charge/discharge operation at a constant current of 0.1 mA was repeated by three cycles. The pause time after the charge and before the start of discharge was set to zero. The capacity at the third cycle was set as the initial discharge capacity of the electricity storage device. The value obtained by dividing the discharge capacity at the third cycle of the charge/discharge operation by the weight of the active substance, namely, the discharge capacity per unit weight of the active substance was calculated. The value of the discharge capacity of the active substance with respect to the theoretical capacity was calculated and represented by the percentage as the utilization factor.

The charge/discharge cycle characteristic evaluation was performed as follows. The upper limit of the charge voltage As is understood from Table 2, electricity storage devices A2, B2 and C2 according to the present invention each have an initial discharge capacity which is 95 to 100% of the theoretical value. This is higher than the initial discharge capacity of electricity storage device E1, which is 60% of the theoretical value.

The capacity maintaining ratios of electricity storage devices A2, B2 and C2 after the 2000th cycle were 89 to 93%. From this, it was confirmed that electricity storage devices A2, B2 and C2 have a highly superb cycle characteristic of maintaining the capacity at about 90% of the initial capacity even after being charged/discharged 2000 times.

It was possible to evaluate the cycle characteristic with the test condition of performing the charge/discharge operation at a large current of 10 mA. From this, it was confirmed that electricity storage devices A2, B2 and C2 can be charged/discharged at a high rate, namely, contain a large-output electrode active substance.

By contrast, the capacity maintaining ratio of comparative example electricity storage device E2 after the 2000th cycle was 75%, which was inferior to the capacity maintaining ratios of electricity storage devices A2, B2 and C2.

These results show that polymer molecules, even being the same in containing tetrachalcogenofulvalene structures in a main chain thereof, may provide significantly different cycle characteristics depending on the molecular structure when being used for the electricity storage devices. The polymers according to the present invention used for electricity storage devices A2, B2 and C2 have a structure in which a tetrachalcogenofulvalene structure is polymerized via acetylene and a phenyl group (—C≡C—Ph—C≡C—), and this structure was confirmed to exhibit a superb charge/discharge cycle characteristic.

Industrial Applicability

A polymer according to the present invention is lightweight, difficult to be dissolved in an organic solvent, and reversibly oxidation/reduction-reactable stably and at a high energy density. Therefore, the polymer is preferably usable for various types of electricity storage devices. An electricity storage device using such a polymer provides a large output and has a large capacity and a superb cycle characteristic. Therefore, such an electricity storage device is preferably usable for various types of mobile devices, transportation devices, uninterruptible power supplies, etc., and also various types of electrochemical devices including biochips.

A polymer according to the present invention is also preferably usable as an organic superconductor material, an organic conductor material, an organic semiconductor material, or an organic magnetic material. A polymer according to the present invention used as such a material is applicable for molecular lines for electric circuits, devices such as transistors, molecular memories and the like, photosensitive elements and photosensors.

Reference Signs List

| | |
|---|---|
| 21 | Case |
| 22 | Positive electrode current collector |
| 23 | Positive electrode active substance layer |
| 24 | Separator |
| 25 | Sealing plate |
| 26 | Negative electrode active substance layer |
| 27 | Negative electrode current collector |
| 28 | Gasket |
| 29 | Electrolytic solution |
| 31 | Positive electrode |
| 32 | Negative electrode |
| 41 | Positive electrode active substance particle |
| 42 | Conductive agent portion |

The invention claimed is:

1. A polymer having a repeating unit structure represented by the following general formula (2), wherein:

in general formula (2), X is an oxygen atom, a sulfur atom, a selenium atom or a tellurium atom; R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group; and the chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom:

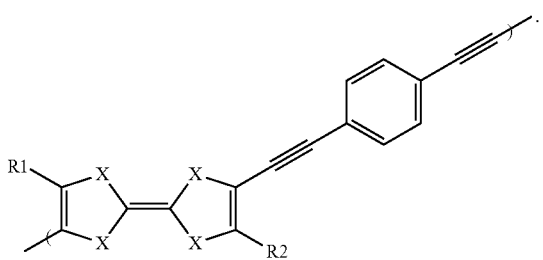

(2)

2. A polymer having a repeating unit structure represented by the following general formula (3), wherein:

in general formula (3), X is an oxygen atom, a sulfur atom, a selenium atom or a tellurium atom; R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group; and the chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom:

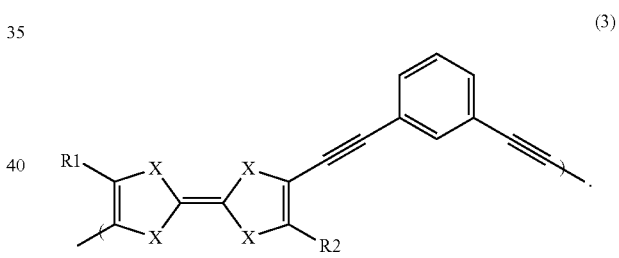

(3)

3. The polymer of claim 2, wherein X is a sulfur atom.

4. The polymer of claim 2, wherein a number of repetition of the repeating unit structure is 4 or greater.

5. The polymer of claim 1, wherein X is a sulfur atom, and R1 and R2 are each a chained saturated hydrocarbon group.

6. The polymer of claim 1, wherein X is a sulfur atom, and R1 and R2 are each a phenyl group.

7. The polymer of claim 2, wherein X is a sulfur atom, and R1 and R2 are each a phenyl group.

8. The polymer of claim 2, wherein X is a sulfur atom, and R1 and R2 are each a methyl group.

9. A semiconductor film containing the polymer defined by claim 2.

10. An electrode, comprising:
a conductive support; and
a polymer film provided on the conductive support and containing the polymer defined by claim 2.

11. The electrode of claim 10, wherein the polymer film contains a conductive substance.

12. An electrode active substance having a repeating unit structure represented by the following general formula (2), wherein:

in general formula (2), X is an oxygen atom, a sulfur atom, a selenium atom or a tellurium atom; R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group; and the chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom:

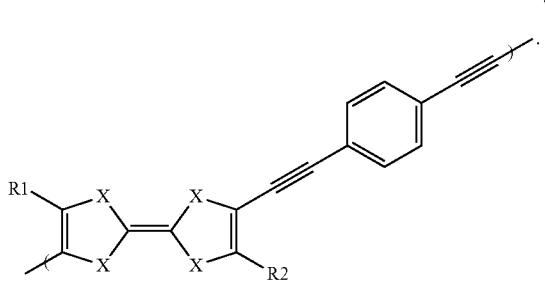

(2)

13. An electrode active substance having a repeating unit structure represented by the following general formula (3), wherein:

in general formula (3), X is an oxygen atom, a sulfur atom, a selenium atom or a tellurium atom; R1 and R1 each independently contains at least one selected from the group consisting of a chained saturated hydrocarbon group, a chained unsaturated hydrocarbon group, a cyclic saturated hydrocarbon group, a cyclic unsaturated hydrocarbon group, a phenyl group, a hydrogen atom, a hydroxyl group, a cyano group, an amino group, a nitro group and a nitroso group; and the chained saturated hydrocarbon group, the chained unsaturated hydrocarbon group, the cyclic saturated hydrocarbon group and the cyclic unsaturated hydrocarbon group each contain at least one selected from the group consisting of a carbon atom, an oxygen atom, a nitrogen atom, a sulfur atom and a silicon atom:

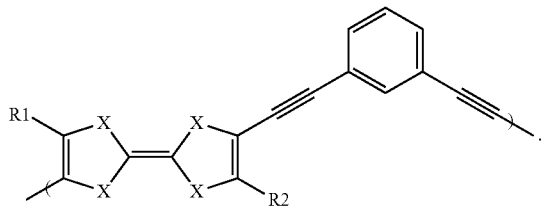

(3)

14. The electrode active substance of claim 13, wherein X is a sulfur atom.

15. The electrode active substance of claim 13, wherein a number of repetition of the repeating unit structure is 4 or greater.

16. The electrode active substance of claim 12, wherein X is a sulfur atom, and R1 and R2 are each a chained saturated hydrocarbon group.

17. The electrode active substance of claim 12, wherein X is a sulfur atom, and 1 and R2 are each a phenyl group.

18. The electrode active substance of claim 13, wherein X is a sulfur atom, and R1 and R2 are each a phenyl group.

19. The electrode active substance of claim 13, wherein X is a sulfur atom, and R1 and R2 are each a methyl group.

20. An electrochemical element, comprising:
a positive electrode, a negative electrode, and an electrolytic solution located between the positive electrode and the negative electrode,
wherein at least one of the positive electrode and the negative electrode contains the electrode active substance defined by claim 12.

21. The electrochemical element of claim 20, wherein the electrolytic solution contains a salt of quaternary ammonium cation or lithium ion and anion.

22. An electricity storage device, comprising:
a positive electrode containing the electrode active substance defined by claim 13;
a negative electrode containing a negative electrode active substance capable of occluding and releasing lithium ion; and
an electrolytic solution containing a salt formed of the lithium ion and anion, and filling a space between the positive electrode and the negative electrode.

23. A mobile electronic device, comprising the electricity storage device defined by claim 22.

24. A vehicle, comprising the electricity storage device defined by claim 22.

* * * * *